US009618930B1

(12) United States Patent
Wu et al.

(10) Patent No.: US 9,618,930 B1
(45) Date of Patent: Apr. 11, 2017

(54) SCHEDULING START-UP PROCESS FOR TIME-CONSTRAINED SINGLE-ARM CLUSTER TOOLS

(71) Applicant: Macau University of Science and Technology, Macau (MO)

(72) Inventors: Naiqi Wu, Macau (MO); Yan Qiao, Macau (MO); Mengchu Zhou, Macau (MO)

(73) Assignee: Macau University of Science and Technology, Macau (MO)

( * ) Notice: Subject to any disclaimer, the term of this patent is extended or adjusted under 35 U.S.C. 154(b) by 0 days.

(21) Appl. No.: 14/918,557

(22) Filed: Oct. 20, 2015

Related U.S. Application Data

(60) Provisional application No. 62/221,034, filed on Sep. 20, 2015.

(51) Int. Cl.
*G05B 19/418* (2006.01)
*B25J 9/16* (2006.01)
*H01L 21/67* (2006.01)
*H01L 21/677* (2006.01)
*H01L 21/68* (2006.01)

(52) U.S. Cl.
CPC ...... *G05B 19/41885* (2013.01); *B25J 9/1669* (2013.01); *G05B 19/41865* (2013.01); *H01L 21/67201* (2013.01); *H01L 21/67742* (2013.01); *H01L 21/68* (2013.01); *G05B 2219/39536* (2013.01)

(58) Field of Classification Search
CPC .............. G05B 19/41885; G05B 19/41865
See application file for complete search history.

(56) References Cited

U.S. PATENT DOCUMENTS 6,122,566 A * 9/2000 Nguyen ............ H01L 21/67167
438/908
6,418,356 B1 * 7/2002 Oh ........................ G06Q 10/06
700/217

(Continued)

OTHER PUBLICATIONS

Kim et al,"Schedule Restoration for Single-Armed Cluster Tools", IEEE Transactions on Semiconductor Manufacturing, 2014, vol. 27; Issue 3; pp. 388-399.*

(Continued)

*Primary Examiner* — Thomas Randazzo
(74) *Attorney, Agent, or Firm* — Spruson & Ferguson (Hong Kong) Limited; Sam T. Yip

(57) ABSTRACT

Due to the trend of using larger wafer diameter and smaller lot size, cluster tools need to switch from processing one lot of wafers to another frequently. It leads to more transient periods in wafer fabrication. Their efficient scheduling and control problems become more and more important. It becomes difficult to solve such problems, especially when wafer residency time constraints must be considered. This work develops a Petri net model to describe the behavior during the start-up transient processes of a single-arm cluster tool. Then, based on the model, for the case that the difference of workloads among the steps is not too large and can be properly balanced, a scheduling algorithm to find an optimal feasible schedule for the start-up process is given. For other cases schedulable at the steady state, a linear programming model is developed to find an optimal feasible schedule for the start-up process.

14 Claims, 5 Drawing Sheets

(56) References Cited

U.S. PATENT DOCUMENTS

| | | | | |
|---|---|---|---|---|
| 6,738,681 | B2* | 5/2004 | Kobayashi | G05B 19/41895 700/100 |
| 6,768,930 | B2* | 7/2004 | Oh | G05B 19/41865 700/102 |
| 9,223,307 | B1* | 12/2015 | Wu | B25J 9/009 |
| 9,227,318 | B1* | 1/2016 | Bai | B25J 9/009 |
| 9,333,645 | B1* | 5/2016 | Wu | B25J 9/0087 |
| 2002/0147960 | A1* | 10/2002 | Jevtic | G05B 19/41865 716/50 |
| 2014/0099176 | A1* | 4/2014 | Nogi | H01L 21/67276 414/217 |

OTHER PUBLICATIONS

Wu et al, "Petri Net-Based Scheduling of Single-Arm Cluster Tools with Reentrant Atomic Layer Deposition Processes", IEEE Transaction on Automation Science and Engineering, 2011; vol. 8; Issue 1; pp. 42-55.*

Yi et al, "Steady-State Throughput and Scheduling Analysis of Multi-Cluster Tools for Semiconductor Manufacturing: A Decompositon Approach", Proceedings of the 2005 IEEE International Conference on Robotics and Automation, 2005; pp. 292-298.*

M. Bader, R. Hall and G. Strasser, "Integrated processing equipment," Solid State Technol., vol. 33, No. 5, pp. 149-154, 1990.

P. Burggraaf, "Coping with the high cost of wafer fabs." Semiconductor International, vol. 38, pp. 45-50, 1995.

Caloini, G. A. Magnani and M. Pezzé, "A technique for designing robotic control systems based on Petri nets," IEEE Transactions on Control Systems and Technology, vol. 6, No. 1, pp. 72-87, 1998.

W. K. V. Chan, J. Yi and S. Ding, "Optimal scheduling of multicluster tools with constant robot moving times, part I: two-cluster analysis," IEEE Transactions on Automation Science and Engineering, vol. 8, No. 1, pp. 5-16, Jan. 2011.

S. Ding, J. Yi and M. Zhang, "Scheduling multi-cluster tools: An integrated event graph and network model approach," IEEE Transactions on Semiconductor Manufacturing, vol. 19, No. 3, pp. 339-351, Aug. 2006.

L. Ferrarini and L. Piroddi, "Modeling and control of fluid transportation operations in production plants with Petri nets," IEEE Transactions on Control Systems and Technology, vol. 16, No. 5, pp. 1090-1098, 2008.

D. Liu, Z. W. Li and M. C. Zhou, "Hybrid Liveness-Enforcing Policy for Generalized Petri Net Models of Flexible Manufacturing Systems," IEEE Transactions on Systems, Man, and Cybernetics: Systems, vol. 43, No. 1, pp. 85-97, Jan. 2013.

Jung and T.-E. Lee, "An efficient mixed integer programming model based on timed Petri nets for diverse complex cluster tool scheduling problems," IEEE Transactions on Semiconductor Manufacturing, vol. 25, No. 2, pp. 186-199, 2012.

T. K. Kim, C. Jung and T. E. Lee, "Scheduling start-up and close-down periods of dual-armed cluster tools with wafer delay regulation" International Journal of Production Research, vol. 50, No. 10, pp. 2785-2795, May 2012.

K. Kim, T. E. Lee and H. J. Kim, "Optimal scheduling of transient cycles for single-armed cluster tools," in Proceedings of the 2013 IEEE International Conference on Automation Science and Engineering, Madison, WI, USA, Aug. 2013a.

H. J. Kim, J. H. Lee, C. Jung and T. E. Lee, "Scheduling cluster tools with ready time constraints for consecutive small lots," IEEE Transactions on Automation Science and Engineering, vol. 10, No. 1, pp. 145-159, Jan. 2013b.

H. J. Kim, J. H. Lee and T. E. Lee, "Noncyclic scheduling of cluster tools with a branch and bound algorithm," IEEE Transactions on Automation Science and Engineering, vol. 12, No. 2, pp. 690-700, Apr. 2015.

J.-H. Kim, T.-E. Lee, H.-Y. Lee and D.-B. Park, "Scheduling analysis of timed-constrained dual-armed cluster tools," IEEE Transactions on Semiconductor Manufacturing, vol. 16, No. 3, 521-534, 2003.

J. H. Lee, H. J. Kim and T. E. Lee, "Scheduling transient periods of dual-armed cluster tools," in Proceedings of the 2012 IEEE International Conference on Mechatronics and Automation, Chengdu, China, pp. 1569-1574, Aug. 2012.

J. H. Lee, H. J. Kim and T. E. Lee, "Scheduling lot switching operations for cluster tools," IEEE Transactions on Semiconductor Manufacturing, vol. 26, No. 4, pp. 592-601, 2013.

J. H. Lee, H. J. Kim and T. E. Lee, "Scheduling cluster tools for concurrent processing of two wafer types," IEEE Transactions on Automation Science Engineering, vol. 11, No. 2, pp. 525-536, 2014.

T.-E. Lee, H.-Y. Lee and Y.-H. Shin, "Workload balancing and scheduling of a single-armed cluster tool," in Proceedings of the 5th APIEMS Conference, Gold Coast, Australia, pp. 1-15, 2004.

T.-E. Lee and S.-H. Park, "An extended event graph with negative places and tokens for timed window constraints," IEEE Transactions on Automation Science and Engineering, vol. 2, No. 4, pp. 319-332, 2005.

D-Y. Liao, M. D. Jeng and M. C. Zhou, "Petri net modeling and Lagrangian relaxation approach to vehicle scheduling in 300 mm semiconductor manufacturing," in Proc. 2004 IEEE Conf. Robot. Autom., New Orleans, LA, 2004, pp. 5301-5306.

M.-J. Lopez and S.-C. Wood, "Systems of multiple cluster tools—configuration, reliability, and performance," IEEE Transactions on Semiconductor Manufacturing, vol. 16, No. 2, pp. 170-178, 2003.

T. L. Perkinson, P. K. Maclarty, R. S. Gyurcsik and R. K. Cavin, III, "Single-wafer cluster tools performance: An analysis of throughput," IEEE Transactions on Semiconductor Manufacturing, vol. 7, No. 2, pp. 369-373, May 1994.

T. L. Perkinston, R. S. Gyurcsik and P. K. Modally, "Single-wafer cluster tool performance: An analysis of effects of redundant chambers and revisitation sequences on throughput," IEEE Transactions on Semiconductor Manufacturing, vol. 9, No. 2, pp. 384-400. May 1996.

Y. Qiao, N. Q. Wu and M. C. Zhou, "Petri net modeling and wafer sojourn time analysis of single-arm cluster tools with residency time constraints and activity time variation," IEEE Transactions on Semiconductor manufacturing, vol. 25, No. 3, pp. 432-446, 2012a.

Y. Qiao, N. Q. Wu and M. C. Zhou, "Real-time scheduling of single-arm cluster tools subject to residency time constraints and bounded activity time variation," IEEE Transactions on Automation Science and Engineering, vol. 9, No. 3, pp. 564-577, 2012b.

Y. Qiao, N. Q. Wu and M. C. Zhou, "A Petri net-based novel scheduling approach and its cycle time analysis for dual-arm cluster tools with wafer revisiting" IEEE Transactions on Semiconductor Manufacturing, vol. 26, No. 1, pp. 100-110, Feb. 2013.

S. Rostami, B. Hamidzadeh and D. Camporese, "An optimal periodic scheduler for dual-arm robots in cluster tools with residency constraints," IEEE Transactions on Robotics and Automation, vol. 17, pp. 609-618, 2001.

Simon, E. C. Castaneda and P. Freedman, "Design and analysis of synchronization for real-time closed-loop control in robotics," IEEE Transactions on Control Systems and Technology, vol. 6, No. 4, pp. 445-461, 1998.

Raymond Tang, Grantham K. H. Pang and Stephen S. Woo, "A continuous fuzzy Petri net tool for intelligent process monitoring and control," IEEE Transactions on Control Systems and Technology, vol. 3, No. 3, pp. 318-329, 1995.

S. Venkatesh, R. Davenport, P. Foxhoven and J. Nulman, "A steady state throughput analysis of cluster tools: Dual-blade versus single-blade robots," IEEE Transactions on Semiconductor Manufacturing, vol. 10, No. 4, pp. 418-424, Nov. 1997.

N. Q. Wu, C. B. Chu, F. Chu and M. C. Zhou, "A Petri net method for schedulability and scheduling problems in single-arm cluster tools with wafer residency time constraints," IEEE Transactions on Semiconductor Manufacturing, vol. 21, No. 2, pp. 224-237, 2008a.

N. Q. Wu and M. C. Zhou, "Avoiding deadlock and reducing starvation and blocking in automated manufacturing systems", IEEE Transactions on Robotics and Automation, vol. 17, No. 5, pp. 657-668, 2001.

(56) References Cited

OTHER PUBLICATIONS

N. Q. Wu and M. C. Zhou, "Modeling and deadlock control of automated guided vehicle systems," IEEE/ASME Transactions on Mechatronics, vol. 9, No. 1, pp. 50-57, 2004.

N. Q. Wu and M. C. Zhou, "Colored time Petri nets for modeling and analysis of cluster tools," Asian Journal of Control, vol. 12, No. 3, pp. 253-266, 2010a.

N. Q. Wu and M. C. Zhou, "A closed-form solution for schedulability and optimal scheduling of dual-arm cluster tools with wafer residency time constraint based on steady schedule analysis," IEEE Transactions on Automation Science and Engineering, vol. 7, No. 2, 303-315, 2010b.

N. Q. Wu, M. C. Zhou and Z. W. Li, "Resource-oriented Petri net for deadlock avoidance in flexible assembly systems," IEEE Transactions on System, Man, & Cybernetics, Part A, vol. 38, No. 1, pp. 56-69, 2008B.

J. Wikborg and T. E. Lee, "Noncyclic scheduling for timed discrete event systems with application to single-armed cluster tools using Pareto-optimal optimization," IEEE Transactions on Automation Science and Engineering, vol. 10, No. 3, pp. 689-710, Jul. 2013.

J. Yi, S. S Ding and M. Zhang, "Steady-state throughput and scheduling analysis of multi-cluster tools: A decomposition approach," IEEE Transactions on Automation Science and Engineering, vol. 5, No. 2, pp. 321-336, Apr. 2008.

H. J. Yoon and D. Y. Lee, "On-line scheduling of integrated single-wafer processing tools with temporal constraints," IEEE Transactions on Semiconductor Manufacturing, vol. 18, No. 3, pp. 390-398, 2005.

M. Zhou and F. DiCesare, "Parallel and sequential mutual exclusions for Petri net modeling of manufacturing systems with shared resources," IEEE Transactions on Robotics and Automation, vol. 7, No. 4, pp. 515-527, 1991.

M. Zhou, F. DiCesare and A. Desrochers, "A hybrid methodology for synthesis of Petri nets for manufacturing systems," IEEE Transactions on Robotics and Automation, vol. 8, pp. 350-361, 1992.

M. C. Zhou and M. D. Jeng, "Modeling, analysis, simulation, scheduling, and control of semiconductor manufacturing systems: a Petri net approach," IEEE Transactions on Semiconductor Manufacturing, vol. 11, No. 3, pp. 333-357, 1998.

M. C. Zhou, C.-H. Wang and X. Y. Zhao, "Automating mason's rule and its application to analysis of stochastic Petri nets," IEEE Transactions on Control Systems and Technology, vol. 3, No. 2, pp. 238-244, 1995.

W. M. Zuberek, "Timed Petri nets in modeling and analysis of cluster tools," IEEE Transaction on Robotics & Automation Magazine, vol. 17, No. 5, pp. 562-575, Oct. 2001.

\* cited by examiner

SCHEDULING START-UP PROCESS FOR TIME-CONSTRAINED SINGLE-ARM CLUSTER TOOLS

CROSS-REFERENCE TO RELATED APPLICATIONS

This application claims the benefit of U.S. Provisional Patent Application No. 62/221,034, filed on Sep. 20, 2015, which is incorporated by reference herein in its entirety.

LIST OF ABBREVIATIONS

CP control policy
LL loadlock
LPM linear programming model
PM process module
PN Petri net

BACKGROUND

Field of the Invention

The present invention generally relates to scheduling a cluster tool, where the cluster tool has a single-arm robot for wafer handling, and plural process modules each for performing a wafer-processing step with a wafer residency time constraint. In particular, the present invention relates to a method for scheduling a start-up process for a single-arm cluster tool with wafer residency time constraints.

List of References

There follows a list of references that are occasionally cited in the specification. Each of the disclosures of these references is incorporated by reference herein in its entirety.

M. Bader, R. Hall and G. Strasser, "Integrated processing equipment," Solid State Technol., vol.33, no.5, pp.149-154, 1990.

P. Burggraaf, "Coping with the high cost of wafer fabs." Semiconductor International, vol.38, pp. 45-50, 1995.

A. Caloini, G. A. Magnani and M. Pezzè, "A technique for designing robotic control systems based on Petri nets," IEEE Transactions on Control Systems and Technology, vol. 6, no. 1, pp. 72-87, 1998.

W. K. V. Chan, J. Yi and S. Ding, "Optimal scheduling of multicluster tools with constant robot moving times, part I: two-cluster analysis," IEEE Transactions on Automation Science and Engineering, vol.8, no. 1, pp. 5-16, January 2011.

S. Ding, J. Yi and M. Zhang, "Scheduling multi-cluster tools: An integrated event graph and network model approach," IEEE Transactions on Semiconductor Manufacturing, vol. 19, no. 3, pp. 339-351, August 2006.

L. Ferrarini and L. Piroddi, "Modeling and control of fluid transportation operations in production plants with Petri nets," IEEE Transactions on Control Systems and Technology, vol. 16, no. 5, pp. 1090-1098, 2008.

D. Liu, Z. W. Li and M. C. Zhou, "Hybrid Liveness-Enforcing Policy for Generalized Petri Net Models of Flexible Manufacturing Systems," IEEE Transactions on Systems, Man, and Cybernetics: Systems, vol. 43, no. 1, pp. 85-97, January 2013.

C. Jung and T.-E. Lee, "An efficient mixed integer programming model based on timed Petri nets for diverse complex cluster tool scheduling problems," IEEE Transactions on Semiconductor Manufacturing, vol. 25, no. 2, pp. 186-199, 2012.

T. K. Kim, C. Jung and T. E. Lee, "Scheduling start-up and close-down periods of dual-armed cluster tools with wafer delay regulation" International Journal of Production Research, vol. 50, no. 10, pp. 2785-2795, May 2012.

D. K. Kim, T. E. Lee and H. J. Kim, "Optimal scheduling of transient cycles for single-armed cluster tools," in Proceedings of the 2013 IEEE International Conference on Automation Science and Engineering, Madison, Wis., USA, August 2013a.

H. J. Kim, J. H. Lee, C. Jung and T. E. Lee, "Scheduling cluster tools with ready time constraints for consecutive small lots," IEEE Transactions on Automation Science and Engineering, vol. 10, no. 1, pp. 145-159, January 2013b.

H. J. Kim, J. H. Lee and T. E. Lee, "Noncyclic scheduling of cluster tools with a branch and bound algorithm," IEEE Transactions on Automation Science and Engineering, vol. 12 , no. 2, pp. 690-700, April 2015.

J. H. Kim, T. E. Lee, H. Y. Lee and D. B. Park, "Scheduling analysis of timed-constrained dual-armed cluster tools," IEEE Transactions on Semiconductor Manufacturing, vol. 16, no. 3, 521-534, 2003.

J. H. Lee, H. J. Kim and T. E. Lee, "Scheduling transient periods of dual-armed cluster tools," in Proceedings of the 2012 IEEE International Conference on Mechatronics and Automation, Chengdu, China, pp. 1569-1574, August 2012.

J. H. Lee, H. J. Kim and T. E. Lee, "Scheduling lot switching operations for cluster tools," IEEE Transactions on Semiconductor Manufacturing, vol. 26, no. 4, pp. 592-601, 2013.

J. H. Lee, H. J. Kim and T. E. Lee, "Scheduling cluster tools for concurrent processing of two wafer types," IEEE Transactions on Automation Science Engineering, vol. 11, no. 2, pp. 525-536, 2014.

T. E. Lee, H. Y. Lee and Y. H. Shin, "Workload balancing and scheduling of a single-armed cluster tool," in Proceedings of the 5th APIEMS Conference, Gold Coast, Australia, pp. 1-15, 2004.

T. E. Lee and S. H. Park, "An extended event graph with negative places and tokens for timed window constraints," IEEE Transactions on Automation Science and Engineering, vol. 2, no. 4, pp. 319-332, 2005.

D. Y. Liao, M. D. Jeng and M. C. Zhou, "Petri net modeling and Lagrangian relaxation approach to vehicle scheduling in 300 mm semiconductor manufacturing," in Proc. 2004 IEEE Conf Robot. Autom., New Orleans, La., 2004, pp. 5301-5306.

M. J. Lopez and S. C. Wood, "Systems of multiple cluster tools—configuration, reliability, and performance," IEEE Transactions on Semiconductor Manufacturing, vol. 16, no. 2, pp. 170-178, 2003.

T. L. Perkinson, P. K. Maclarty, R. S. Gyurcsik and R. K. Cavin, III, "Single-wafer cluster tools performance: An analysis of throughput," IEEE Transactions on Semiconductor Manufacturing, vol. 7, no. 2, pp. 369-373, May 1994.

T. L. Perkinston, R. S. Gyurcsik and P. K. Maclarty, "Single-wafer cluster tool performance: An analysis of effects of redundant chambers and revisitation sequences on throughput," IEEE Transactions on Semiconductor Manufacturing, vol. 9, no. 2, pp. 384-400. May 1996.

Y. Qiao, N. Q. Wu and M. C. Zhou, "Petri net modeling and wafer sojourn time analysis of single-arm cluster tools with residency time constraints and activity time variation," IEEE Transactions on Semiconductor manufacturing, vol. 25, no. 3, pp. 432-446, 2012a.

Y. Qiao, N. Q. Wu and M. C. Zhou, "Real-time scheduling of single-arm cluster tools subject to residency time constraints and bounded activity time variation," *IEEE Transactions on Automation Science and Engineering*, vol. 9, no. 3, pp. 564-577, 2012b.

Y. Qiao, N. Q. Wu and M. C. Zhou, "A Petri net-based novel scheduling approach and its cycle time analysis for dual-arm cluster tools with wafer revisiting" *IEEE Transactions on Semiconductor Manufacturing*, vol. 26, no. 1, pp. 100-110, February 2013.

S. Rostami, B. Hamidzadeh and D. Camporese, "An optimal periodic scheduler for dual-arm robots in cluster tools with residency constraints," *IEEE Transactions on Robotics and Automation*, vol. 17, pp. 609-618, 2001.

D. Simon, E. C. Castaneda and P. Freedman, "Design and analysis of synchronization for real-time closed-loop control in robotics," *IEEE Transactions on Control Systems and Technology*, vol. 6, no. 4, pp. 445-461, 1998.

Raymond Tang, Grantham K. H. Pang and Stephen S. Woo, "A continuous fuzzy Petri net tool for intelligent process monitoring and control," *IEEE Transactions on Control Systems and Technology*, vol. 3, no. 3, pp. 318-329, 1995.

S. Venkatesh, R. Davenport, P. Foxhoven and J. Nulman, "A steady state throughput analysis of cluster tools: Dual-blade versus single-blade robots," *IEEE Transactions on Semiconductor Manufacturing*, vol. 10, no. 4, pp. 418-424, November 1997.

N. Q. Wu, C. B. Chu, F. Chu and M. C. Zhou, "A Petri net method for schedulability and scheduling problems in single-arm cluster tools with wafer residency time constraints," *IEEE Transactions on Semiconductor Manufacturing*, vol. 21, no. 2, pp. 224-237, 2008a.

N. Q. Wu and M. C. Zhou, "Avoiding deadlock and reducing starvation and blocking in automated manufacturing systems", *IEEE Transactions on Robotics and Automation*, vol. 17, no.5, pp. 657-668, 2001.

N. Q. Wu and M. C. Zhou, "Modeling and deadlock control of automated guided vehicle systems," *IEEE/ASME Transactions on Mechatronics*, vol. 9, no. 1, pp. 50-57, 2004.

N. Q. Wu and M. C. Zhou, *System modeling and control with resource-oriented Petri nets*, CRC Press, Taylor & Francis Group, New York, October 2009.

N. Q. Wu and M. C. Zhou, "Colored time Petri nets for modeling and analysis of cluster tools," *Asian Journal of Control*, vol. 12, no. 3, pp. 253-266, 2010a.

N. Q. Wu and M. C. Zhou, "A closed-form solution for schedulability and optimal scheduling of dual-arm cluster tools with wafer residency time constraint based on steady schedule analysis," *IEEE Transactions on Automation Science and Engineering*, vol. 7, no. 2, 303-315, 2010b.

N. Q. Wu, M. C. Zhou and Z. W. Li, "Resource-oriented Petri net for deadlock avoidance in flexible assembly systems," *IEEE Transactions on System, Man, & Cybernetics, Part A*, vol. 38, no. 1, pp. 56-69, 2008b.

U. Wikborg and T. E. Lee, "Noncyclic scheduling for timed discrete event systems with application to single-armed cluster tools using Pareto-optimal optimization," *IEEE Transactions on Automation Science and Engineering*, vol. 10, no. 3, pp. 689-710, July 2013.

J. Yi, S. Ding and M. Zhang, "Steady-state throughput and scheduling analysis of multi-cluster tools: A decomposition approach," *IEEE Transactions on Automation Science and Engineering*, vol. 5, no. 2, pp. 321-336, April 2008.

H. J. Yoon and D. Y. Lee, "On-line scheduling of integrated single-wafer processing tools with temporal constraints," *IEEE Transactions on Semiconductor Manufacturing*, vol. 18, no. 3, pp. 390-398, 2005.

M. Zhou and F. DiCesare, "Parallel and sequential mutual exclusions for Petri net modeling of manufacturing systems with shared resources," *IEEE Transactions on Robotics and Automation*, vol. 7, no. 4, pp. 515-527, 1991.

M. Zhou, F. DiCesare and A. Desrochers, "A hybrid methodology for synthesis of Petri nets for manufacturing systems," *IEEE Transactions on Robotics and Automation*, vol. 8, pp. 350-361, 1992.

M. C. Zhou and M. D. Jeng, "Modeling, analysis, simulation, scheduling, and control of semiconductor manufacturing systems: a Petri net approach," *IEEE Transactions on Semiconductor Manufacturing*, vol. 11, no. 3, pp. 333-357, 1998.

M. C. Zhou and K. Venkatesh, Modeling, simulation and control of flexible manufacturing systems: *A Petri net approach*, World Scientific, Singapore, 1998.

M. C. Zhou, C. H. Wang and X. Y. Zhao, "Automating mason's rule and its application to analysis of stochastic Petri nets," *IEEE Transactions on Control Systems and Technology*, vol. 3, no. 2, pp. 238-244, 1995.

W. M. Zuberek, "Timed Petri nets in modeling and analysis of cluster tools," *IEEE Transaction on Robotics & Automation Magazine*, vol. 17, no. 5, pp.562-575, October 2001.

Description of the Related Art

In semiconductor manufacturing, wafers are processed in cluster tools with a single-wafer processing technology. Such technology allows manufacturers to process wafers one by one at each process module (PM) in cluster tools. These tools can provide a reconfigurable, flexible and efficient environment, leading to better quality control and reduced lead time [Bader et al., 1990; and Burggraaf, 1995]. In a cluster tool, there are several process modules (PMs), an aligner, a wafer handling robot, and loadlocks (LLs) for wafer cassette loading/unloading. All these modules are mechanically linked together in a radial way and computer-controlled. The robot in the center of the tool can have a single arm or dual arms, thus resulting in a single- or a dual-arm cluster tool as respectively shown in FIG. 1A and 1B.

With two LLs, a cluster tool can be operated consecutively without being interrupted such that it can operate in a steady state for most of time. Great efforts have been made in its modeling and performance evaluation [Chan et al., 2011; Ding et al., 2006; Perkinston et al., 1994; Perkinston et al., 1996; Venkatesh et al., 1997; Wu and Zhou, 2010a; Yi et al., 2008; Zuberek, 2001; and Lee et al., 2014]. It is found that, under the steady state, a cluster tool operates in two different regions: transport and process-bound ones. For the former, its robot is always busy and the robot task time in a cycle determines its cycle time; while for the latter, its robot has idle time in a robot task cycle and thus the processing time of its PMs dominates its cycle time. Since the robot moving time from one PM to another is much shorter than wafer processing time [Kim et al., 2003], a backward scheduling is optimal for single-arm cluster tools [Lee et al., 2004; and Lopez and Wood, 2003]. For a dual-arm cluster tool, a swap strategy is efficient [Venkatesh et al., 1997] for it can simplify robot tasks and thus reduces cycle time.

For some wafer fabrication processes, a strict constraint on the wafer sojourn time in a PM called residency time constraint must be considered in scheduling a cluster tool [Kim et al., 2003; Lee and Park, 2005; Rostami et al., 2001; and Yoon and Lee, 2005]. Such a constraint requires that a wafer should be unloaded from a PM within a limited time after being processed; otherwise, the wafer would be damaged due to the high temperature and residual chemical gas in the PM. However, no buffer between PMs in a cluster tool makes it complicated to schedule the tool to satisfy wafer residency time constraints. Methods are presented in [Kim et al., 2003; Lee and Park, 2005; and Rostami et al., 2001] to solve this scheduling problem and find an optimal periodic schedule for dual-arm cluster tools. Necessary and sufficient schedulability conditions are proposed for both single- and dual-arm cluster tools and if schedulable, closed-form scheduling algorithms are derived to find the optimal cyclic schedules [Wu et al., 2008a; and Wu and Zhou, 2010b].

Due to the trends of larger wafer diameter and smaller lot sizes, cluster tools need to switch from processing one lot of wafers to another one frequently. This leads to more transient periods in wafer fabrication, which includes start-up and close-down processes. Their efficient scheduling and control problems become more and more important. They become very difficult to solve especially when wafer residency time constraints must be considered. Although most existing studies [Chan et al., 2011; Ding et al., 2006; Perkinston et al., 1994; Perkinston et al., 1996; Venkatesh et al., 1997; Wu and Zhou, 2010a; Yi et al., 2008; Zuberek, 2001; Qiao et al., 2012a and 2012b; Qiao et al., 2013; and Lee et al., 2014] aim at finding an optimal periodical schedule, few researches focus on scheduling for transient states [Lee et al., 2012 and 2013; Kim et al., 2012, 2013a, 2013b, and 2013c; and Wikborg and Lee, 2013] despite their increasing importance. In [Kim et al., 2012], with a given robot task sequence, the transient period for the start-up and close-down processes is minimized for a dual-arm cluster tool. In [Kim et al., 2013a, and Wikborg and Lee, 2013], scheduling methods are proposed for noncyclic scheduling problem for single-arm cluster tools. With small batch, lot switching occurs frequently. Thus, studies are conducted and techniques are developed for scheduling lot switching processes for both single and dual-arm cluster tools [Lee et al., 2012 and 2013; and Kim et al., 2013b and 2013c].

However, all the above studies about scheduling a transient process in a cluster tool are not applicable for a single-arm cluster tool with wafer residency time constraints, which are not considered in [Lee et al., 2012 and 2013; Kim et al., 2013a, 2013b, and 2013c; and Wikborg and Lee, 2013]. Such constraints can make an optimal schedule for a transient process without residency time constraints considered infeasible. With wafer residency time constraints, Kim et al. [2012] propose scheduling methods to minimize the transient period for the start-up and close-down processes for dual-arm cluster tools. Since different scheduling strategies are required to schedule single-arm cluster tools. Their research results cannot be used to find an optimal feasible transient process for residency time-constrained single-arm cluster tools.

There is a need in the art to derive a solution to this optimal feasible transient process and to develop a method for scheduling a single-arm cluster tool based on the derived optimal solution.

SUMMARY OF THE INVENTION

The present invention provides a method for scheduling a cluster tool. The cluster tool comprises a single-arm robot for wafer handling, a LL for wafer cassette loading and unloading, and plural process modules each for performing a wafer-processing step with a wafer residency time constraint.

The method includes scheduling a start-up process for the cluster tool. The start-up process is developed based on Scheduling Algorithm 1 and the LPM model detailed below.

Preferably, the method further includes scheduling a steady-state process according to results obtained in the start-up process.

Other aspects of the present invention are disclosed as illustrated by the embodiments hereinafter.

DETAILED DESCRIPTION

A PN model is developed for the start-up process of a single-arm cluster tool in Section A. Section B recalls the schedulability conditions and scheduling analysis for single-arm cluster tools [Wu et al., 2008]. Then, a scheduling algorithm and a linear programming model are developed for the start-up transient process scheduling in Section C.

Hereinafter, the notation $N_n$, n being a positive integer, denotes a set containing positive integers from 1 to n, i.e. $N_n=\{1, 2, \ldots, n\}$.

A. Petri Net Modeling and Control

A.1. Finite Capacity Petri Nets

As an effective tool, PNs are widely used in modeling, analysis, and control of discrete-event systems, process industry, and robotic control systems [Zhou and DiCesare, 1991; Zhou et al., 1992 and 1995; Tang et al., 1995; Simon et al., 1998; Caloini et al., 1998; Zhou and Jeng, 1998; Wu and Zhou, 2001 and 2004; Liao et al., 2004; Ferrarini and Piroddi, 2008; Jung and Lee, 2012; Wu et al., 2008b; and Liu et al., 2013]. Following Zhou and Venkatesh [1998], the present work adopts a finite capacity PN to model a single-arm cluster tool. It is defined as PN=(P, T, I, O, M, K), where $P=\{p_1, p_2, \ldots, p_m\}$ is a finite set of places; $T=\{t_1, t_2, \ldots, t_n\}$ is a finite set of transitions with $P \cup T \neq \emptyset$ and $P \cap V = \emptyset$; $I: P \times T \to N=\{0, 1, 2, \ldots\}$ is an input function; $O: P \times T \to N$ is an output function; $M: P \to N$ is a marking representing the number of tokens in places with $M_0$ being the initial marking; and $K: P \to N \setminus \{0\}$ is a capacity function where K(p) represents the largest number of tokens that p can hold at a time.

The preset of transition t is the set of all input places to t, i.e. $^\bullet t=\{p:p\in P$ and $I(p, t)>0\}$. Its postset is the set of all output places from t, i.e., $t^\bullet=\{p:p\in P$ and $O(p, t)>0\}$. Similarly, p's preset $^\bullet p=\{t\in T: O(p, t)>0\}$ and postset $p^\bullet=\{t\in T: I(p, t)>0\}$. The transition enabling and firing rules can be found in [Wu and Zhou, 2009].

A.2. PN Model for Cluster Tools

In the present work, it is assumed that there are $n \geq 2$ steps in a cluster tool and only one PM serves for each step. Let ($PM_1$, $PM_2$, $PM_3$) denote the wafer flow pattern, where $PM_i$, $i \in N_n$, represents a process model being used to process wafers at Step i. Thus, a wafer needs to be processed at $PM_1$–$PM_n$, sequentially before it is completed. Wu et al. [2008a] developed a PN model and conducted the steady periodical scheduling analysis for a single-arm cluster tool with wafer residency time constraints. We briefly introduce their PN model next.

Figures 1A, 1B:
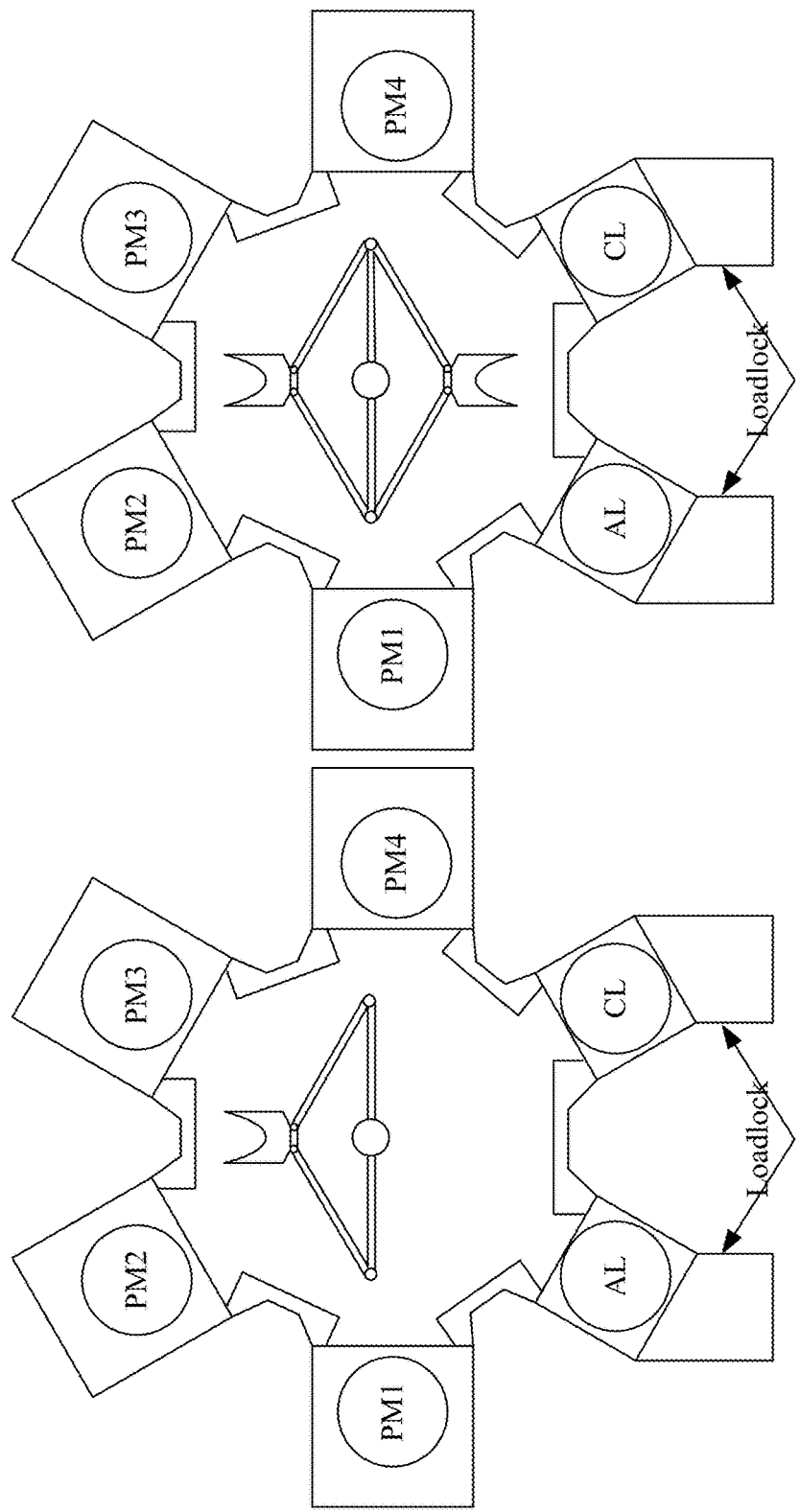
FIG. 1A depicts an example of a cluster tool having a single-arm robot.
FIG. 1B depicts an example of a cluster tool having a dual-arm robot.
Figure 2:
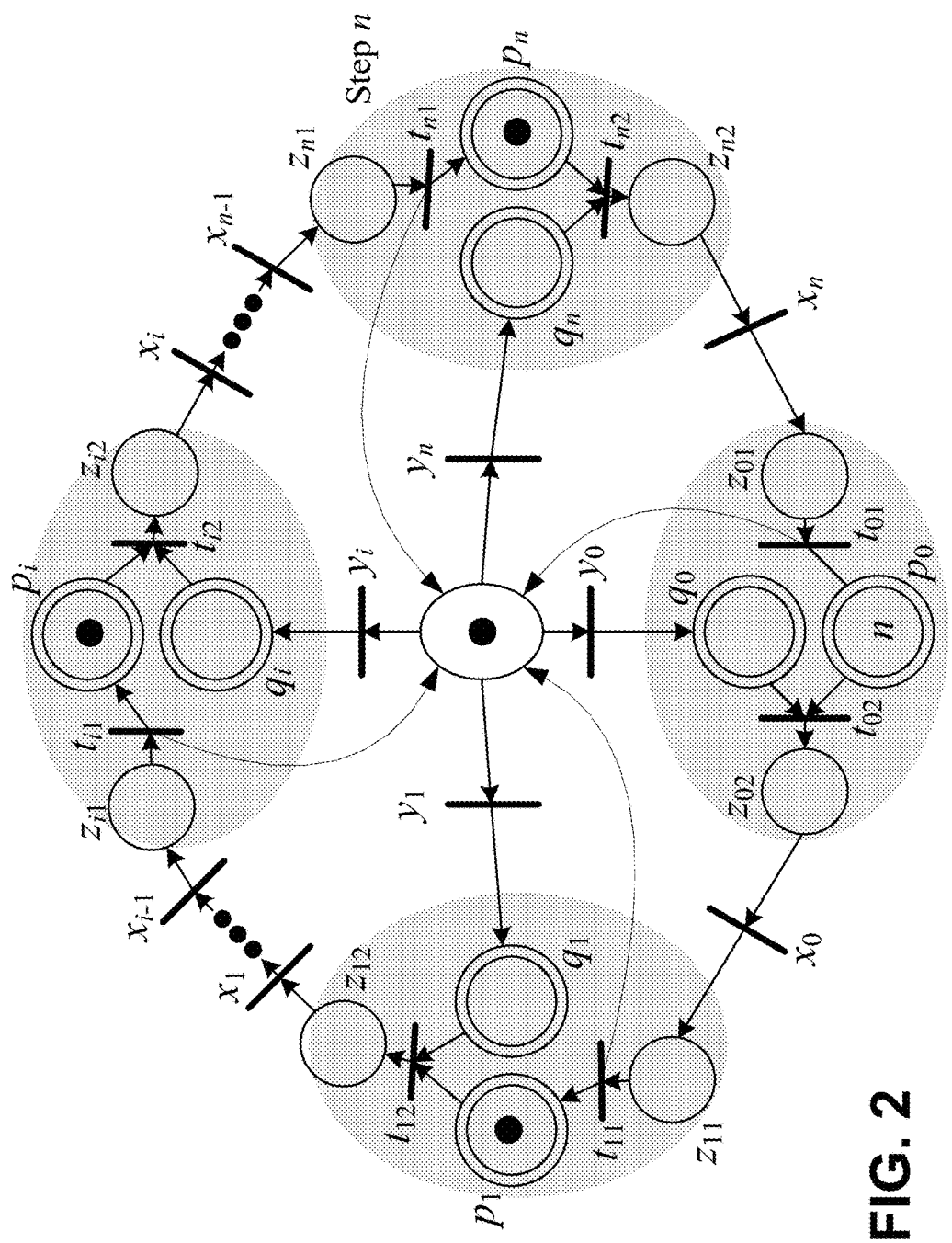
FIG. 2 depicts a Petri net (PN) for the steady state of a single-arm cluster tool according to [Wu et al., 2008].

In such a PN model, Step i is modeled by timed place $p_i$ with $K(p_i)=1$, $i \in N_n$. The LLs are treated just as a processing step called Step 0. Since the LLs can hold all the wafers in a tool, they are modeled by $p_0$ with $K(p_0)=\infty$. The robot is modeled by place r with $K(r)=1$, meaning that it has only one arm and can hold one wafer at a time. When $M(r)=1$, it represents that the robot arm is available. When $M(p_i)=1$, $i \in N_n$, a wafer is being processed in the PM for Step i. When the robot arrives at Step i for unloading a wafer, the wafer may be under way. Then, it has to wait there for some time. Timed place $q_i$, $i \in N_n$, is added to model the robot's waiting at Step i before unloading a wafer there and $M(q_i)=1$ means that the robot is waiting at Step i. Note that the explicit representation of a robot wait as a place is critically important to deal with residency time constraints. Non-timed place $z_{ij}$ is used to model the state at which it is ready to load a wafer to Step i or the wafer unloading from Step i ends. Transitions are used to model the robot tasks. Timed $t_{i1}$, $i \in N_n$, models loading a wafer into Step i, and $t_{01}$ models loading a completed wafer into a LL. Timed $t_{i2}$, $i \in N_n$, models unloading a wafer from Step i, and $t_{02}$ models unloading a raw wafer from a LL. Timed transition $y_i$, $i \in N_{n-2} \cup \{0\}$, represents the robot's moving from Steps i+2 to i without carrying a wafer; while transitions $y_{n-1}$ and $y_n$ represent the robot's moving from a LL to Step n-1 and Steps 1 to n, respectively. Timed transition $x_i$, $i \in N_{n-1} \cup \{0\}$, models the robot's moving from Steps i to i+1 with a wafer held, and $x_n$ models the robot's moving from Steps n to 0. Pictorially, $p_i$'s and $q_i$'s are denoted by ⊚, $z_{ij}$'s by ○, and r's by ⊖. Then, the PN model for a single-arm cluster tool is shown in FIG. 2.

At the steady state, every process module has one wafer being processed, i.e., $\Sigma_{i=1}^{2} K(p_i)$ wafers are being processed. For the PN model in FIG. 2, consider marking M with $M(p_i)=1$, $i \in N_n$, and $M(r)=1$. At this marking, $y_0$ is enabled and firing $y_0$ leads the PN to a dead marking, or the PN is deadlock-prone. Thus, according to [Wu et al., 2008], a control policy is proposed to make it deadlock-free.

Control Policy 1 (CP1): At any M of the PN model in FIG. 2, $y_i$, $i \in N_{n-1} \cup \{0\}$, is said to be control-enabled if $M(p_{i+i})=0$; and $y_n$ is said to be control-enabled if $M(p_i)=1$, $i \in N_n$.

Before a cluster tool reaches its steady state, it must experience a start-up process. For a single-arm cluster tool, because the processing time is much longer than the robot task time, a backward strategy is found to be optimal [Lee et al., 2004; and Lopez and Wood, 2003]. Thus, a backward strategy is also used to operate the single-arm cluster tool for the start-up process. At the initial state, there is no wafers being processed in the tool, or the tool is empty. Let $M_{s0}$ denote the initial state. When the tool starts to work, the robot unloads a wafer from the LLs, moves to Step 1, and loads this wafer into Step 1. Let $M_{s1}$ denote the state of the system when the robot finishes the robot task of loading the wafer into Step 1. Then, the robot should wait there till this wafer is completed. After the wafer is processed, the robot unloads this wafer from Step 1 as soon as possible, moves to Step 2, loads this wafer into Step 2, returns to the LLs and unloads a raw wafer from the LLs, moves to Step 1, and loads the raw wafer into Step 1. At this time, Step 1 and Step 2 both have one wafer being processed. Thus, let $M_{s2}$ denote the state of the system at this time. In the following operations of the system, the tool would reach a state that the Step i, $i \in N_d$ and d<n, has one wafer being processed and Step i, d<i≤n, is empty. To model this state, a PN model is developed shown in FIG. 3.

Figure 3:
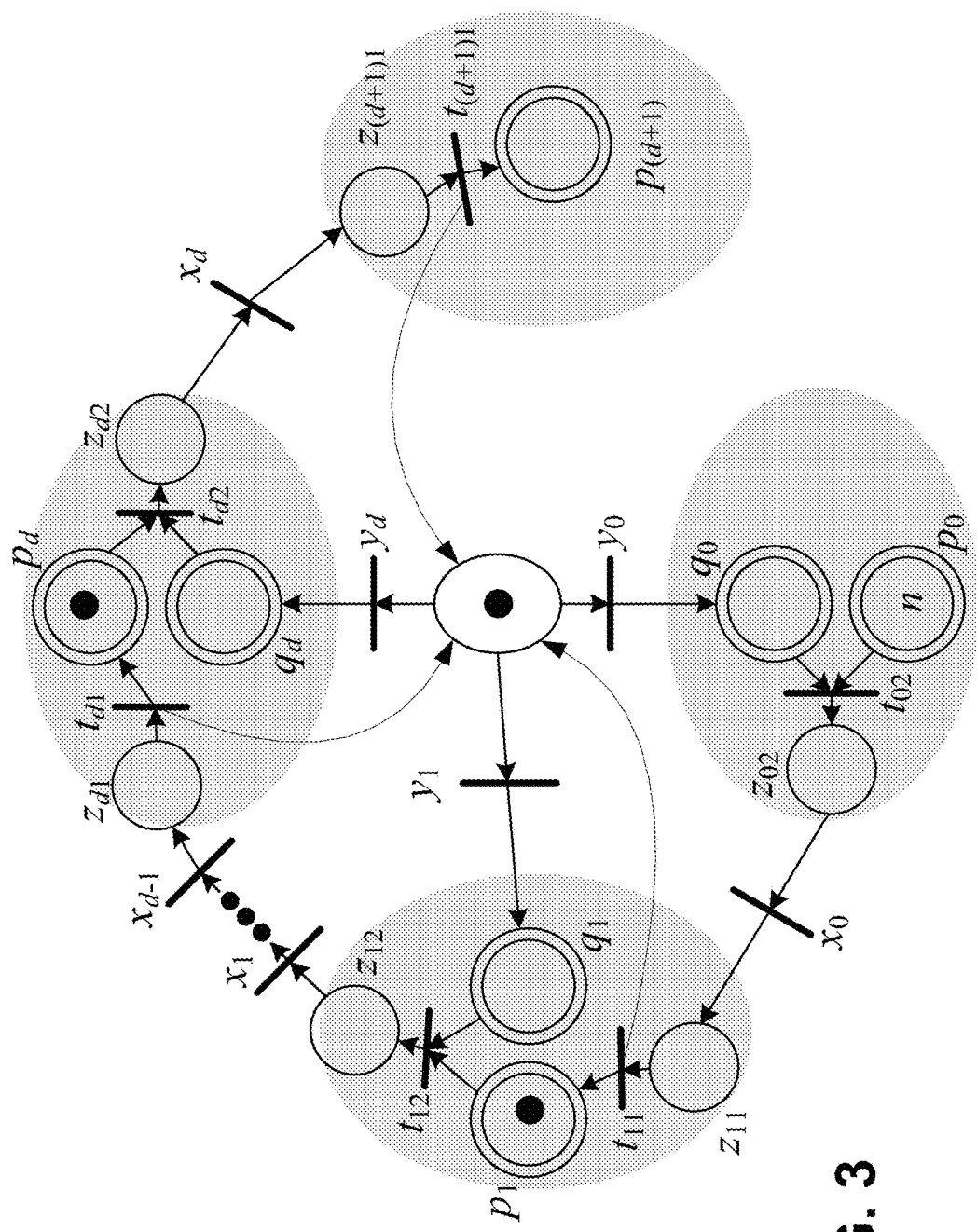
FIG. 3 depicts a Petri net for the start-up process of a single-arm cluster tool.

The places in the PN model in FIG. 3 have the same meanings as the ones in FIG. 2. Transitions $t_{i1}$, $i \in N_{d+1}$, d<n and d≥2, $t_{i2}$, $i \in N_d \cup \{0\}$, d<n and d≥2, $x_i$, $i \in N_d \cup \{0\}$, d<n and d≥2, and $y_i$, $i \in N_{d-1} \cup \{0\}$, d<n and d≥2, in the PN model in FIG. 3 also have the same meanings as the ones in FIG. 2. Transition $y_d$ represents the robot's moving from Steps 1 to d. Because Step i, $i \in N_d$, d<n and d≥2, has one wafer being processed and Step i, d<i≤n, is empty, we have $M(p_i)=K(p_i)$, $i \in N_d$, d<n and d≥2, and $M(r)=1$. At the marking shown in FIG. 3, $y_0$ is enabled and can fire. It can be seen that firing $y_0$ leads the PN to a dead marking, or the PN is deadlock-prone. Then, a control policy is introduced to make it deadlock-free.

Control Policy 2 (CP2): For the PN model in FIG. 3, $y_i$, $i \in N_d \cup \{0\}$, d<n and d≥2, is said to be control-enabled if $M(p_{i+1})=0$.

With CP2, the start-up process could be described by running the PN model in FIG. 3 shown as follows. At the state $M_{s2}$, Steps 1 and 2 both have one wafer being processed and the robot stays at Step 1. To describe the state $M_{s2}$, we can set d=2 in the PN model and $M_{s2}(p_i)=K(p_i)$, $i \in N_2$, and $M_{s2}(r)=1$ holds. According to CP2, the following transitions firing sequence is: firing $y_2$ (moving to Step 2)→firing $t_{22}$ (unloading a wafer from Step 2)→firing $x_2$ (moving from Steps 2 to 3)→firing $t_{31}$ (loading the wafer into Step 3)→firing $y_i$ (moving from Steps 3 to 1)→firing $t_{12}$ (unloading a wafer from Step 1)→firing $x_1$ (moving from Steps 1 to 2)→firing $t_{21}$ (loading the wafer into Step 2)→firing $y_0$ (moving from Steps 2 to 0)→firing $t_{02}$ (unloading a wafer from Step 0)→firing $x_0$ (moving from Steps 0 to 1)→firing $t_{11}$ (loading the wafer into Step 1). At this time, the system reaches state $M_{s3}$ such that $M_{s3}(p_i)=K(p_i)$, $i \in N_3$, and $M_{s3}(r)=1$ hold. Then, we can set d=3 in the PN model. According to CP2, the PN model can evolve to state $M_{s4}$ with $M_{s4}(p_i)=K(p_i)$, $i \in N_4$, and $M_{s4}(r)=1$. Similarly, with the PN model in FIG. 3 and CP2, the PN model can evolve to state $M_{sn}$ with $M_{sn}(p_i)=K(p_i)$, $i \in N_n$, and $M_{sn}(r)=1$. At this time, the cluster tool is full of wafers and it reaches the steady state.

A.3. Activity Time Modeling

In the PN models in FIGS. 2 and 3, to describe the temporal aspect of a cluster tool, both transitions and places are associated with time. We use t to denote the time for the robot task of moving with or without carrying a wafer. Time $a_i$ is used to denote the time taken for completing a wafer at a step. It is assumed that the time taken for the robot's unloading a wafer from a step and loading a wafer into a step/LL is same and denoted by α. Transition $t_{02}$ models the robot's unloading a wafer from the LLs and aligning a wafer. Therefore, the time associated with $t_{02}$ is $α_0$ that is different from α. The robot's waiting time (denoted by $ω_i$) in $q_i$ is determined by a schedule and can be a real number in $[0, \infty)$, or $ω_i \in [0, \infty)$. The detailed explanation of temporal features is summarized in Table 1.

TABLE 1

The Time Durations Associated with Transitions and Places

| Transition or place | Actions | Allowed time duration |
|---|---|---|
| $t_{i1}$ | Robot loads a wafer into Step i, $i \in N_n \cup \{0\}$ | α |
| $t_{i2}$ | Robot unloads a wafer from Step i, $i \in N_n$ | |

TABLE 1-continued

The Time Durations Associated with Transitions and Places

| Transition or place | Actions | Allowed time duration |
|---|---|---|
| $t_{02}$ | Robot unloads a wafer from a LL and aligns it | $\alpha_0$ |
| $y_i$ | Robot moves from a step to another without carrying a wafer | $\mu$ |
| $x_i$ | Robot moves from a step to another with a wafer carried | $\lambda$ |
| $p_i$ | A wafer being processed in $p_i$, $i \in N_n$ | $a_i$ |
| $q_i$ | robot waits before unloading a wafer from Step i, $i \in N_n \cup \{0\}$ | $\omega_i$ |
| $z_{ij}$ | No activity is associated | |

With wafer residency time constraints, the deadlock-freeness does not mean that the PNs shown in FIGS. 2 and 3 are live, because a token in $p_i$ cannot stay there beyond a given time interval. Let $\tau_i$ be the sojourn time of a token in $p_i$ and $\delta_i$ the longest time for which a wafer can stay in $p_i$ after it is processed. Then, the liveness of the PN model is defined as follows.

Definition 1: The PN models in FIGS. 2 and 3 for single-arm cluster tools with residency time constraints are live, if 1) at any marking with a token in $p_i$, $\forall i \in N_n$, and when $t_{i2}$ fires $a_i \leq \tau_i \leq a_i + \delta_i$ holds; 2) at any marking with a token in $p_i$, $i \in N_d$ and $d < n$, and when $t_{i2}$ fires $a_i \leq \tau_i \leq a_i + \delta_i$ holds, respectively.

B. Schedulability Conditions

Before scheduling the start-up process, we recall the necessary and sufficient schedulability conditions of a single-arm cluster tool with wafer residency time constraints under the steady state derived in [Wu et al., 2008].

B.1. Timeliness Analysis for the Steady State

It follows from [Wu et al., 2008] that, to complete the processing of a wafer at Step i, $i \in N_{n-1}$, it takes $\tau_i + 4\alpha + 3\mu + \omega_{i-1}$ time units, where $\tau_i$ should be within $[a_i, a_i + \delta_i]$. With only one PM at Step i, $i \in N_n$, we have that the lower permissive cycle time at Step i is $$\theta_{iL} = a_i + 4\alpha + 3\mu + \omega_{i-1}, i \in N_n \setminus \{1\}. \quad (1)$$

The upper permissive cycle time at Step i is $$\theta_{iU} = a_i + 4\alpha + 3\mu + \omega_{i-1} + \delta_i, i \in N_n \setminus \{1\}. \quad (2)$$

For Step 1, the lower one is $$\theta_{iL} = a_1 + 3\alpha + \alpha_0 3\mu + \omega_0. \quad (3)$$

Its upper one is $$\theta_{iU} = a_1 + 3\alpha + \alpha_0 3\mu + \omega_0 + \delta_1. \quad (4)$$

It follows from (1)-(4) that the robot waiting time $\omega_i$, $i \in N_{n-1} \cup \{0\}$, affects the permissive wafer sojourn time. Thus, by carefully regulating them, one can change the permissive range among the steps. By removing them from the above expressions, we obtain the lower and upper workloads with no robot waiting for each step as follows:

$$\vartheta \text{ hd } iL = a_i + 4\alpha + 3\mu, i \in N_n \setminus \{1\}, \quad (5)$$

$$\vartheta \text{ hd } iU = a_i + 4\alpha + 3\mu + \delta_i, i \in N_n \setminus \{1\}, \quad (6)$$

$$\vartheta \text{ hd } iL = a_1 + 3\alpha + \alpha_0 + 3\mu, \quad (7)$$

and $$\vartheta \text{ hd } iU = a_1 + 3\alpha + \alpha_0 + 3\mu + \delta_1, \quad (8)$$

where $\vartheta_{jL}$, and $\vartheta_{jU}$ are the lower and the upper workloads, respectively, for Step j, $j \in N_n$.

To schedule a single-arm cluster tool with residency time constraints, one has to ensure $a_i \leq \tau_i \leq a_i + \delta_i$. Hence, we need to know how $\tau_i$ is calculated. According to [Wu et al., 2008], we have that $$\tau_i = 2(n+1)\mu + (2n+1)\alpha + \alpha_0 + \Sigma_{d=0}^n \omega_d - (4\alpha + 3\mu + \omega_0) = \Psi - (4\alpha + 3\mu + \omega_{i-1}), i \in N_n \setminus \{1\} \quad (9)$$

and $$\tau_i = 2(n+1)\mu + (2n+1)\alpha + \alpha_0 + \Sigma_{d=0}^n \omega_d - (3\alpha + \alpha_0 + 3\mu + \omega_0) = \Psi - (3\alpha + \alpha_0 + 3\mu + \omega_0). \quad (10)$$

The robot cycle time is given by $$\Psi = 2(n+1)\mu + (2n+1)\alpha + \alpha_0 + \Sigma_{d=0}^n \omega_d = \Psi_1 + \Psi_2 \quad (11)$$

where $\Psi_1 = 2(n+1)\mu + (2n+1)\alpha + \alpha_0$ is a known constant and $\Psi_2 = \Sigma_{d=0}^n \omega_d$ is to be decided by a schedule. It should be pointed out that $\Psi$ is independent of the $\omega_i$'s. Let $\theta_1 = \tau_1 + 3\alpha + \alpha_0 + 3\mu + \omega_0$ and $\theta_i = \tau_i + 4\alpha + 3\mu + \omega_{i-1}, i \in N_n - \{1\}$, denote the cycle time for Step i, $i \in N_n$. Then, it can be seen that, by making $\omega_{i-1} > 0$, the cycle time of Step i is increased without increasing the wafer sojourn time. Thus, it is possible to adjust the robot waiting time to balance the wafer sojourn time among the steps such that a feasible schedule can be obtained. For a periodic schedule in a steady state, we have $$\theta = \theta_1 = \theta_2 = \ldots = \theta_n = \Psi. \quad (12)$$

In (11), $\mu$, $\alpha$, and $\alpha_0$ are all deterministic, only $\omega_d$, $d \in N_n \cup \{0\}$, are changeable, i.e., $\Psi_1$ is deterministic and $\Psi_2$ can be regulated. Thus, based on the PN model shown in FIG. 2, one can schedule a single-arm cluster tool with residency time constraints by appropriately regulating $\omega_d$, $d \in N_n \cup \{0\}$, such that (12) holds and at the same time the wafer residency time constraints are fully satisfied.

B.2. Schedulability Conditions for the Steady State Scheduling

To find a feasible cyclic schedule, the key is to know under what conditions there exists $\theta$ such that the system is schedulable. Notice that, in (5)-(8), $\vartheta_{iL}$ and $\vartheta_{iU}$ denote the lower and upper bounds of $\theta_i$, respectively. Let $\vartheta_{max} = \max\{\vartheta_{iL}, i \in N_n\}$. Then, Wu et al. [2008] establish the following schedulability conditions.

Theorem 1: If $\vartheta_{max} \leq \vartheta_{iU}$ and $\Psi_1 \leq \vartheta_{iU}$, $i \in N_n$, a single-arm cluster tool with residency time constraints is schedulable.

For this case, when $\vartheta_{max} \leq \vartheta_{iU}$ and $\Psi_1 \leq \vartheta_{max}$, $i \in N_n$, the tool is process-bound. When $\vartheta_{iL} \leq \Psi_1 \leq \vartheta_{iU}$, $i \in N_n$, a tool is transport-bound. With $\vartheta_{max} \leq \vartheta_{iU}$, $i \in N_n$, the difference of the workloads among the steps is not too large. Thus, by properly setting $\omega_i$'s, the workloads among the steps can be balanced such that there is a feasible cyclic schedule. It follows from [Wu et al., 2008] that, in this case, one can simply set $\omega_i = 0$, $i \in N_{n-1} \cup \{0\}$, and $\omega_n = \max\{\vartheta_{max} - \Psi_1, 0\}$ such that $\Psi = \max\{\vartheta_{max}, \Psi_1\}$ holds. In this way, a feasible schedule is found. Further, it is optimal in terms of cycle time.

By Theorem 1, to make the tool schedulable requires that the workloads among the steps are not too large, i.e. $[\vartheta_{1L}, \vartheta_{1U}] \cap [\vartheta_{2L}, \vartheta_{2U}] \cap \ldots \cap [\vartheta_{nL}, \vartheta_{nU}] \neq \emptyset$. However, sometimes we have $[\vartheta_{1L}, \vartheta_{1U}] \cap [\vartheta_{2L}, \vartheta_{2U}] \cap \ldots \cap [\vartheta_{nL}, \vartheta_{nU}] = \emptyset$. In this case, let $E = \{i | i \in N_n, \vartheta_{iU} < \vartheta_{max}\}$ and $F = N_n \setminus E$. It follows from [Wu et al., 2008] that the time for completing a wafer at Step i can be increased by setting $\omega_{i-1} > 0$ without changing sojourn time $\tau_i$. Hence, a cluster tool may be made schedulable even if the workloads among the steps are not well balanced. To do so, we balance the workloads among the steps by setting $\omega_{i-1}$'s as follows:

$$\omega_{i-1} = \begin{cases} 0, i \in F \\ \vartheta_{max} - (a_1 + \delta_1 + 3\alpha + \alpha_0 + 3\mu), 1 \in E \\ \vartheta_{max} - (a_i + \delta_i + 4\alpha + 3\mu), i \in E \cap \{2, 3, 4, \ldots, n\} \end{cases} \quad (13)$$

Theorem 2: If $[\vartheta_{1L}, \vartheta_{1U}] \cap [\vartheta_{2L}, \vartheta_{2U}] \cap \ldots \cap [\vartheta_{nL}, \vartheta_{nU}] = \emptyset$, $\vartheta_U < \vartheta_{max}$, $i \in E \neq \emptyset$, $\vartheta_{iU} \geq \vartheta_{max}$, $i \in F$, and $\Sigma_{i \in E} \omega_{i-1} + \Psi_1 \leq \vartheta_{max}$, a single-arm cluster tool with residency time constraints is schedulable with $\omega_{i-1}$, $i \in N_n$, being set by (13).

In this case, with the robot waiting time $\omega_{i-1}$, $i \in N_n$, being set by (13), without changing $\tau_i \theta_i$ for completing a wafer at Step i can be increased such that the workload among the steps can be properly balanced. Notice that, by (13), the robot waiting time $\omega_{i-1}$, $i \in N_n$, is set, and then let $\omega_n = \vartheta_{max} - (\Psi_1 + \Sigma_{i \in E} \omega_{i-1})$ such that $\Psi = \vartheta_{max}$ holds. Thus, a feasible schedule is obtained and the cycle time is optimal. According to [Wu et al., 2008], the conditions given by Theorems 1 and 2 are the necessary and sufficient schedulability conditions for a single-arm cluster tool with residency time constraints. In the next section, we conduct the start-up process scheduling analysis for the system.

C. Start-up Process Scheduling

C.1. Temporal Properties in Start-up Process

At the initial state denoted by $M_{s0}$, the cluster tool is idle. When the tool starts to work, the robot unloads a wafer from the LLs, moves to Step 1, and loads this wafer into Step 1. At this time, $M_{s1}$ is reached. From states $M_{s0}$ to $M_{s1}$, it takes $(\alpha_0 + \mu + \alpha)$ time units. Then, the robot should wait there for $a_1$ time units before the wafer in Step 1 is completed. Then, $(\alpha_0 + 3\alpha + 3\mu)$ time units would be taken for performing the following robot task sequence: unloads this wafer from Step 1 as soon as possible, moves to Step 2, loads this wafer into the Step 2, returns to the LLs and unloads a raw wafer from the LLs, moves to Step 1, and loads the raw wafer into Step 1. At this time, both Steps 1 and 2 have one wafer being processed and $M_{s2}$ is reached. From $M_{s1}$ to $M_{s2}$, it takes $(a_1 + \alpha_0 + 3\alpha + 3\mu)$ time units.

Observing the PN model shown in FIG. 3, we have that $M_{sd}(p_i) = K(p_i)$, $i \in N_d$ and $2 \leq d \leq n-2$, and $M_{sd}(r) = 1$. With CP2, the PN model can evolve to state $M_{s(d+1)}$ with $M_{s(d+1)}(p_i) = K(p_i)$, $i \in N_{d+1}$, and $M_{s(d+1)}(r) = 1$, and then to $M_{s(d+2)}$ with $M_{s(d+2)}(p_i) = K(p_i)$, $i \in N_{d+2}$, and $M_{s(d+2)}(r) = 1$. During the evolution from $M_{s(d+1)}$ to $M_{s(d+2)}$, the robot should sequentially go to Steps $(d+1)$, $d$, $\ldots$, and 1 for unloading the processed wafers. Thus, with wafer residency time constraints, it is necessary to know how much time is needed to complete the processing of a wafer at Step i, $i \in N_{d+1}$. Notice that the wafers unloaded from Step i, $i \in N_{d+1}$, during the period from $M_{s(d+1)}$ to $M_{s(d+2)}$ are all the ones loaded into Step i, $i \in N_{d+1}$, during the period from $M_{sd}$ to $M_{s(d+1)}$. Thus, from the PN model in FIG. 3, CP2, and the period from $M_{sd}$ to $M_{s(d+2)}$, to complete the processing of a wafer in Step i, $i \in N_{d+1}$, the following transition firing (activities) sequence must be executed: Firing $t_{i2}$ (time $\alpha$) $\rightarrow x_i$ (time $\mu$) $\rightarrow t_{(i+1)1}$ (time $\alpha$) $\rightarrow y_{i-1}$ (time $\mu$) $\rightarrow$ robot waiting in $q_{i-1}$ (time $\omega_{i-1}$) $\rightarrow t_{(i-1)2}$ (time $\alpha$) $\rightarrow x_{i-1}$ (time $\mu$) $\rightarrow t_{(i+1)1}$ (time $\alpha$) $\rightarrow$ processing a wafer at Step i (time $\tau_i$) $\rightarrow t_{i2}$ (time $\alpha$) again. In this way, a cycle is completed and it takes $(\tau_i + 4\alpha + 3\mu + \omega_{i-1})$ time units to complete a wafer. In fact, for a wafer unloaded from Step i, $i \in N_d$, during the period from $M_{sd}$ to $M_{sd(d+1)}$, $2 \leq d < n$, it also takes $(\tau_i + 4\alpha + 3\mu + \omega_{i-1})$ time units to complete this wafer. Notice that $\tau_i$ should be within $[a_i, a_i + \delta_i]$. When $\tau_i = a_i$, we have the lower permissive time to complete a wafer at Step i, $i \in N_d \setminus \{1\}$, which equals to the one given by (1). When $\tau_i = a_i + \delta_i$, we have the upper permissive time to complete a wafer at Step i, which equals to the one given by (2). For Step 1, the lower and upper permissive time to complete a wafer equals to the ones in (3) and (4), respectively. Then, if the robot waiting time is removed from (1)-(4), the lower and upper workloads without robot waiting for each step can be obtained via (5)-(8), respectively.

EQNS. (5)-(8) present the workload balance information that affects the existence of a feasible schedule. It follows from (2) and (6) that $\theta_{iU} > \vartheta_{iU}$ if $\omega_{i-1} > 0$. It implies that, by making $\omega_{i-1} > 0$, the cycle time of Step i is increased without increasing the wafer sojourn time. Thus, it is possible to adjust the robot waiting time such that the permissive wafer sojourn time ranges among the steps are balanced to some extent to guarantee the feasibility. To do so, we need to know how $\tau_i$ should be calculated. The wafer sojourn time at $p_i$ depends on the robot tasks and the workloads of the steps. From the PN model shown in FIG. 3 and CP2, during the evolutions from $M_{s(d-1)}$ to $M_{sd}$, a wafer ($W_1$) is loaded by the robot into Step i: Firing $y_{d-1} \rightarrow$ waiting in $q_{d-1} \rightarrow$ firing $t_{(d-1)2} \rightarrow$ firing $x_{d-1} \rightarrow$ firing $t_{d1} \rightarrow$ firing $y_{d-2} \rightarrow$ waiting in $q_{d-2} \rightarrow$ firing $t_{(d-2)2} \rightarrow$ firing $x_{d-2} \rightarrow$ firing $t_{(d-1)1} \rightarrow \ldots \rightarrow$ firing $y_1 \rightarrow$ waiting in $q_{i-1} \rightarrow$ firing $t_{i2}$ with unloading a wafer from Step i $\rightarrow$ firing $x_i \rightarrow$ firing $t_{(i+1)1} \rightarrow$ firing $y_{i-1} \rightarrow$ waiting in $q_{i-1} \rightarrow$ firing $t_{(i-1)2} \rightarrow$ firing $x_{i-1} \rightarrow$ firing $t_{i1}$ to load wafer $W_1$ into Step i $\rightarrow \ldots \rightarrow y_1 \rightarrow$ waiting in $q_1 \rightarrow$ firing $t_{12} \rightarrow x_1 \rightarrow$ firing $t_{21} \rightarrow$ firing $y_0 \rightarrow$ waiting in $q_0 \rightarrow$ firing $t_{02} \rightarrow$ firing $x_0 \rightarrow$ firing $t_{11}$. Then, from the PN model shown in FIG. 3 and CP2, during the evolutions from $M_{sd}$ to $M_{s(d+1)}$, wafer $W_2$ is unloaded by the robot from Step i: Firing $y_d \rightarrow$ waiting in $q_d \rightarrow$ firing $t_{d2} \rightarrow$ firing $x_d \rightarrow$ firing $t_{(d+1)1} \rightarrow$ firing $y_{(d-1)} \rightarrow$ waiting in $q_{(d-1)} \rightarrow$ firing $t_{(d-1)2} \rightarrow$ firing $x_{d-1} \rightarrow$ firing $t_{d1} \rightarrow \ldots \rightarrow$ firing $y_i \rightarrow$ waiting in $q_i \rightarrow$ firing $t_{i2}$ to unload wafer $W_1$ from Step i $\rightarrow$ firing $x_i \rightarrow$ firing $t_{(i+1)1} \rightarrow$ firing $y_{i-1} \rightarrow$ waiting in $q_{i-1} \rightarrow$ firing $t_{(i-1)2} \rightarrow$ firing $x_{i-1} \rightarrow$ firing $t_{i1} \rightarrow \ldots \rightarrow y_1 \rightarrow$ waiting in $q_1 \rightarrow$ firing $t_{12} \rightarrow x_1 \rightarrow$ firing $t_{21} \rightarrow$ firing $y_0 \rightarrow$ waiting in $q_0 \rightarrow$ firing $t_{02} \rightarrow$ firing $x_0 \rightarrow$ firing $t_{11}$. Thus, from the above PN evolutions we have that, during the evolution from $M_{sd}$ to $M_{s(d+1)}$, $2 \leq d < n$, the wafer sojourn time in $p_i$, $i \in N_d$, is given by $$\tau_1 = 2(d+1)\mu + (2d+1)\alpha + \alpha_0 + \sum_{j=0}^{d} \omega_j - (3\alpha + \alpha_0 + 3\mu + \omega_0) \quad (14)$$

and $$\tau_i = 2(d+1)\mu + (2d+1)\alpha + \alpha_0 + \sum_{j=0}^{d} \omega_j - (4\alpha + 3\mu + \omega_{i-1}), \quad (15)$$

$$1 < i \leq d.$$

Let $\Psi_{sd(d+1)}$ and $\Psi_{sd(d+1)1}$ denote the robot task time for transferring the tool from states $M_{sd}$ to $M_{s(d+1)}$ with and without robot waiting time considered, respectively. Thus, we have $$\psi_{sd(d+1)} = 2(d+1)\mu + (2d+1)\alpha + \alpha_0 + \sum_{j=0}^{d} \omega_j \quad (16)$$

and $$\Psi_{sd(d+1)1} = 2(d+1)\mu + (2d+1)\alpha + \alpha_0. \quad (17)$$

It follows from (14)-(17) that to schedule the transient process of a residency-time constrained single-arm cluster tool is to appropriately regulate $\omega_j$, $j \in N_d \cup \{0\}$, such that the wafer residency time constraints at each step are all satisfied.

C.2. Scheduling for Start-up Process

Feasibility is an essential requirement for scheduling a transient process of a cluster tool. As we have mentioned that, at initial state $M_{s0}$, the cluster tool is idle. When the tool reaches states $M_{s1}$ to $M_{sn}$, Steps 1 to n have one wafer being processed, respectively. For the start-up process, the robot tasks are determined. Thus, we just need to determine the robot waiting time during the period from $M_{s0}$ to $M_{sn}$ to find a feasible schedule for the start-up process. Then, we have the following schedulability proposition.

Proposition 1: A start-up process of a single-arm cluster tool with wafer residency time constraints is schedulable if there exists the robot waiting time setting during the period from $M_{s0}$ to $M_{sn}$ such that the wafer residency time constraint at each step is satisfied.

With Proposition 1, we know that it is necessary to propose a method to regulate the robot waiting time during the period from $M_{s0}$ to $M_{sn}$ such that the cluster tool can enter the desired steady state from the initial state without violating the wafer residency time constraints.

In a cluster tool, it is reasonable to assume that there are more than one processing step. For the tool with two processing steps, the start-up process from $M_{s0}$ to $M_{s2}$ could be described by a robot task sequence $\sigma_1$: Unloading a raw wafer ($W_2$) from the LLs (time $\alpha_0$)→moving to Step 1 (time $\mu$)→loading wafer $W_2$ into Step 1 (time $\alpha$)→waiting at Step 1 for $\omega_1 = a_1$ time units→unloading wafer $W_2$ from Step 1 (time $\alpha$)→moving to Step 2 (time $\mu$)→loading wafer $W_2$ into Step 2 (time $\alpha$)→moving to the LLs (time $\mu$)→waiting at the LLs for $\omega_0$ time units→unloading a raw wafer ($W_3$) from the LLs (time $\alpha_0$)→moving to Step 1 (time $\mu$)→loading wafer $W_3$ into Step 1 (time $\alpha$). At this time, the system reaches state $M_{s2}$. In $\sigma_1$, only robot waiting time $\omega_0$ is unknown. Let $|\sigma_1|$ denote the time needed to perform sequence $v_1$. Thus, $|\sigma_1| = 2\alpha_0 + 4\alpha + 4\mu + a_1 + \omega_0$. Therefore, for the single-arm cluster tool, to obtain a feasible start-up schedule is to determine the robot waiting time $\omega_0$. For the single-arm cluster tool with n>2 processing steps, during the process from $M_{s0}$ to $M_{s2}$, the robot task sequence is also $\sigma_1$. Then, the system keeps working according to the PN model in FIG. 3 and CP2 till it reaches state $M_{sn}$. For this case, the robot waiting time is also unknown during the process from $M_{s0}$ to $M_{sn}$. Let $\vartheta_{dmax} = \max\{\vartheta_{iL}, i \in N_d\}$. To solve the scheduling problem, the following algorithm is developed.

Scheduling Algorithm 1: If $\vartheta_{max} \leq \vartheta_{iU}$ and $\Psi_1 \leq \vartheta_{iU}$, $i \in N_n$, the robot waiting time is set as follows.

Situation 1: A single-arm cluster tool has two steps:
1) During the process from $M_{s0}$ to $M_{s2}$, the tool operates according to the robot task sequence $\sigma_1$ and set $\omega_0 = 0$ and $\omega_1 = a_1$.

Situation 2: A single-arm cluster tool has n steps, n>2:
1) During the process from $M_{s0}$ to $M_{s2}$, the performance of the tool is same as the one regulated by 1) in Situation 1;
2) During the process from $M_{sd}$ to $M_{s(d+1)}$, $2 \leq d < n$, the tool operates according to the PN model in FIG. 3 and CP2 and set $\omega_i = 0$, $i \in N_{d-1} \cup \{0\}$, and $\omega_d = \max\{\vartheta_{dmax} - \Psi_{sd(d+1)1}, 0\}$.

In this case, there are two situations. For Situation 1, there are two steps in a single-arm cluster tool. Then, during the start-up process from $M_{s0}$ to $M_{s2}$, the tool operates according to the robot task sequence $\sigma_1$, and the robot waiting time $\omega_0$ and $\omega_1$ in $\sigma_1$ can be set as $\omega_0 = 0$ and $\omega_1 = a_1$. With $M_{s2}$ being reached, the system reaches its steady state. For Situation 2, a single-arm cluster tool has n steps, n>2. From $M_{s0}$ to $M_{s2}$, the performance of the tool is same as the one regulated by 1) in Situation 1. Then, during the process from $M_{sd}$ to $M_{s(d+1)}$, $2 \leq d < n$, the tool operates according to the PN model in FIG. 3 and CP2. At the same time, the robot waiting time is set as $\omega_i = 0$, $i \in N_{d-1} \cup \{0\}$, and $\omega_d = \max\{\vartheta_{dmax} - \Psi_{sd(d+1)1}, 0\}$ such that $\Psi_{sd(d+1)} = \max\{\vartheta_{dmax}, \Psi_{sd(d+1)1}\}$. When the tool reaches state $M_{sn}$, the system reaches its steady state. Then, by the PN model in FIG. 2 and CP1, the system operates with the backward strategy. By Scheduling Algorithm 1, a schedule could be found for the start-up process. Then, the next question is if this obtained schedule is feasible. The following theorem answers it.

Theorem 3: For a single-arm cluster tool with wafer residency time constraints, if $\vartheta_{max} \leq \vartheta_{iU}$, $\Psi_1 \leq \vartheta_{iU}$, $i \in N_n$, a schedule obtained by Scheduling Algorithm 1 is feasible.

Proof: Consider Situation 1. For the start-up process from $M_{s0}$ to $M_{s2}$, the robot performs the robot tasks $\sigma_1$. It is easy to find that wafer $W_2$ can be unloaded from Step 1 without violating the residency time constraints. Then, $W_3$ is delivered to Step 2. When $M_{s2}$ is reached, the system enters its desired steady state. Consider Situation 2. By 1) for Situation 2 of Algorithm 1, similarly, the robot can perform the robot tasks $\sigma_1$ such that the cluster tool can reach $M_{s2}$ from $M_{s0}$ without violating the wafer residency time constraints. Then, by 2) for Situation 2 of Algorithm 1, the tool operates according to the PN model in FIG. 3 and CP2 during the process from $M_{sd}$ to $M_{s(d+1)}$, $2 \leq d < n$. At the same time, $\omega_i = 0$, $i \in N_{d-1} \cup \{0\}$, and $\omega_d = \{\vartheta_{dmax} - \Psi_{sd(d+1)1}, 0\}$. It follows from (14) and (15) that $\sigma_1 = 2(d+1)\mu + (2d+1)\alpha + \alpha_0 + \Sigma_{j=0}^{d}\omega_j - (3\alpha + \alpha_0 + 3\mu + \omega_0) = 2(d+1)\alpha + \alpha_0 \max\{\vartheta_{dmax} - \Psi_{sd(d+1)1}, 0\} - (3\alpha + \alpha_0 + 3\mu)$ and $\tau_i = 2(d+1)\mu + (2d+1)\alpha + \alpha_0 + \Sigma_{j=0}^{d}\omega_j - (4\alpha + 3\mu + \omega_{i-1}) = 2(d+1)\mu + (2d+1)\alpha + \alpha_0 + \max\{\vartheta_{dmax} - \Psi_{sd(d+1)1}, 0\} - (4\alpha + 3\mu)$, $1 < i \leq d$, hold, respectively. Then, there are two cases. Case 1: $\vartheta_{dmax} \geq \Psi_{sd(d+1)1}$. Then, we have $\tau_1 = 2(d+1)\mu + (2d+1)\alpha + \alpha_0 + \vartheta_{dmax} - \Psi_{sd(d+1)1} - (3\alpha + \alpha_0 + 3\mu)$ and $\tau_i = 2(d+1)\mu + (2d+1)\alpha + \alpha_0 + \vartheta_{dmax} - \Psi_{sd(d+1)1} - (4\alpha + 3\mu)$, $1 < i \leq d$, hold. Then, by (17) and $\vartheta_{max} \leq \vartheta_{iU}$, $i \in N_n$, we have $\vartheta_{iL} - (3\alpha + \alpha_0 + 3\mu) \leq \tau_1 = \vartheta_{dmax} - (3\alpha + \alpha_0 + 3\mu) \leq \vartheta_{iU} - (3\alpha + \alpha_0 + 3\mu)$ and $\vartheta_{iL} - (4\alpha + 3\mu) \leq \tau_i = \vartheta_{dmax} - (4\alpha + 3\mu) \leq \vartheta_{iU} - (4\alpha + 3\mu)$, $1 < i \leq d$. Thus, it follows from (5)-(8) that $a_1 = \vartheta_{1L} - (3\alpha + \alpha_0 + 3\mu) \leq \tau_1 \leq \vartheta_{1U} - (3\alpha + \alpha_0 + 3\mu) = a_1 + \delta_1$ and $a_i = \vartheta_{iL} - (4\alpha + 3\mu) \leq \tau_i \leq \vartheta_{iU} - (4\alpha + 3\mu) = a_i + \delta_i$, $1 < i \leq d$, hold. Case 2: $\vartheta_{dmax} < \Psi_{sd(d+1)1}$. Then from (17), we have $\tau_1 = 2(d+1)\mu + (2d+1)\alpha + \alpha_0 - (3\alpha + \alpha_0 + 3\mu) = \Psi_{sd(d+1)1} - (3\alpha + \alpha_0 + 3\mu)$ and $\tau_i = 2(d+1)\mu + (2d+1)\alpha + \alpha_0 - (4\alpha + 3\mu) = \Psi_{sd(d+1)1} - (4\alpha + 3\mu)$, $1 < i \leq d$, hold. By the assumption of $\Psi_1 \leq \vartheta_{iU}$, $i \in N_n$, we have $\tau_1 = \Psi_{sd(d+1)1} - (3\alpha + \alpha_0 + 3\mu) < \Psi_1 - (3\alpha + \alpha_0 + 3\mu) \leq \vartheta_{1U} - (3\alpha + \alpha_0 + 3\mu)$ and $\tau_i = \Psi_{sd(d+1)1} - (4\alpha + 3\mu) < \Psi_1 - (4\alpha + 3\mu) \leq \vartheta_{iU} - (4\alpha + 3\mu)$, $1 < i \leq d$. Then, it follows from (5)-(8), $\vartheta_{max} \leq \vartheta_{iU}$, $i \in N_n$, and $\vartheta_{dmax} < \Psi_{sd(d+1)1}$ that $a_1 = \vartheta_{1L} - (3\alpha + \alpha_0 + 3\mu) \leq \vartheta_{dmax} - (3\alpha + \alpha_0 + 3\mu) < \tau_1 = \Psi_{sd(d+1)1} - (3\alpha + \alpha_0 + 3\mu) < \vartheta_{1U} - (3\alpha + \alpha_0 + 3\mu) = a_1 + \delta_1$ and $a_i = \vartheta_{iL} - (4\alpha + 3\mu) \leq \vartheta_{dmax} - (4\alpha + 3\mu) < \tau_i = \Psi_{sd(d+1)1} - (4\alpha + 3\mu) < \vartheta_{iU} - (4\alpha + 3\mu) = a_i + \delta_i$, $1 < i \leq d$. Therefore, during the start-up process from $M_{s0}$ to $M_{sn}$, the wafer residency time constraints at each step are all satisfied. Hence, the theorem holds.

In the case of Situation 1, by Algorithm 1, the robot performs $\sigma_1$ such that the cluster tool can successfully go through the start-up process from $M_{s0}$ to $M_{s2}$ without violating any residency time constraints. Also, it takes $|\sigma_1| = 2\alpha_0 + 4\alpha + 4\mu + a_1$ time units for the start-up process. In the case of Situation 2, by Algorithm 1, the schedule is same as the one before $M_{s2}$ is reached. Then, by Algorithm 1, we need to dynamically adjust the robot waiting time at step d during the process from $M_{sd}$ to $M_{s(d+1)}$, $2 \leq d < n$, such that $\Psi_{sd(d+1)1} = \max\{\vartheta_{dmax}, \Psi_{sd(d+1)1}\}$. Thus, it takes $|\sigma_1| + \Sigma_{d=2}^{n-1}\max(\vartheta_{dmax}, \Psi_{sd(d+1)1})$ time units for the start-up process. For a single-arm cluster tool with n≥2 steps, when $M_{sn}$, is reached, the system enters its desired steady state. In the following evolution, the system operates with the backward strategy. Based on Theorem 1, for the steady state scheduling, a feasible and optimal schedule is obtained by setting $\omega_i=0$, $i \in N_{n-1} \cup \{0\}$, and $\omega_n = \max\{\vartheta_{max} - \Psi_1, 0\}$ such that $\Psi = \max\{\vartheta_{max}, \Psi_1\}$ holds. Then, the following theorem proves its optimality.

Theorem 4: For a single-arm cluster tool with wafer residency time constraints, if $\vartheta_{max} \leq \vartheta_{iU}$, $\Psi_1 \leq \vartheta_{iU}$, $i \in N_n$, a schedule obtained by Scheduling Algorithm 1 for the start-up process is optimal.

Proof Situation 1: For the start-up process from $M_{s0}$ to $M_{s2}$, the robot performs the robot tasks $\sigma_1$. If there be a schedule better than the one obtained by Algorithm 1, it must be that the robot waiting time $\omega_1$ is shortened because of $\omega_0=0$. However, if $\omega_1$ is less than $a_1$, the wafer being processed at Step 1 cannot be processed. Therefore, for Situation 1, the obtained schedule by Algorithm 1 is optimal. For Situation 2, similar to Situation 1, the obtained schedule by Algorithm 1 for the process from $M_{sd}$ to $M_{s2}$ is optimal. It follows from Theorem 3 that during the process from $M_{sd}$ to $M_{s(d+1)}$, $2 \leq d < n$, we have $\tau_i = 2(d+1)\mu + (2d+1)\alpha + \alpha_0 + \max\{\vartheta_{dmax} - \Psi_{sd(d+1)1}, 0\} - (3\alpha + \alpha_0 + 3\mu)$ and $\tau_i = 2(d+1)\mu + \max\{\vartheta_{dmax} - \Psi_{sd(d+1)1}, 0\} - (4\alpha + 3\mu)$, $1 < i \leq d$, hold, respectively. It is assumed that $\vartheta_{dmax} = \vartheta_{kL}$, $1 \leq k \leq d$. Then, we have $\tau_1 = 2(d+1)\mu + (2d+1)\alpha + \alpha_0 + \max\{\vartheta_{1L} - \Psi_{sd(d+1)1}, 0\} - (3\alpha + \alpha_0 + 3\mu)$ if $\vartheta_{dmax} = \vartheta_{1L}$ and $\tau_k = 2(d+1)\mu + (2d+1)\alpha + \alpha_0 + \max\{\vartheta_{kL} - \Psi_{sd(d+1)1}, 0\} - (4\alpha + 3\mu)$ if $\vartheta_{dmax} = \vartheta_{kL}$, $1 < k \leq d$. If $\vartheta_{dmax} \geq \Psi_{sd(d+1)1}$, we have $\vartheta_{dmax} = \Psi_{sd(d+1)}$ by Algorithm 1. By (17) and (5)-(8), we have $\tau_1 = \vartheta_{1L} - (3\alpha + \alpha_0 + 3\mu) = a_1$ if $\vartheta_{dmax} = \vartheta_{1L}$ and $\tau_k = \vartheta_{kL} - (4\alpha + 3\mu) = a_k$ if $\vartheta_{dmax} = \vartheta_{kL}$, $1 < k \leq d$, hold. This means that it takes $\Psi_{sd(d+1)} = \vartheta_{kL}$ time units for the process from $M_{sd}$ to $M_{s(d+1)}$, $2 \leq d < n$. Thus, for the process from $M_{sd}$ to $M_{s(d+1)}$, $2 \leq d < n$, the wafer sojourn time just equals to $a_k$ at Step k. If there exists a schedule for the process from $M_{sd}$ to $M_{s(d+1)}$, $2 \leq d < n$, better than the one obtained by Algorithm 1, there must exist Step k where the wafer sojourn time is less than $a_k$. This means the wafer at Step k cannot be processed. If $\vartheta_{dmax} < \Psi_{sd(d+1)1}$, a better schedule for the process from $M_{sd}$ to $M_{s(d+1)}$, $2 \leq d < n$, cannot be found because $\Psi_{sd(d+1)1}$ cannot be shortened. Therefore, the obtained schedule by Algorithm 1 for the process from $M_{sd}$ to $M_{s(d+1)}$, $2 \leq d < n$, is also optimal. Hence, the theorem holds.

By Theorem 3, the workloads among the steps are properly balanced, i.e. $[\vartheta_{1L}, \vartheta_{1U}] \cap [\vartheta_{2L}, \vartheta_{2U}] \cap \ldots \cap [\vartheta_{nL}, \vartheta_{nU}] \neq \emptyset$. However, there is also another case with $[\vartheta_{1L}, \vartheta_{1U}] \cap [\vartheta_{2L}, \vartheta_{2U}] \cap \ldots \cap [\vartheta_{nL}, \vartheta_{nU}] = \emptyset$. Under the steady state, the cycle time is a constant. Then, a feasible schedule could be found by setting $\omega_{i-1} > 0$, $i \in E$, to reduce the wafer sojourn time $\tau_i$ without changing the time for completing a wafer at Step i [Wu et al., 2008]. For the transient process, we have: 1) wafers are processed at Step i, $i \in E$, during the process from $M_{sd}$ to $M_{s(d+1)}$ and $M_{s(d+1)}$ to $M_{s(d+2)}$, $2 \leq d \leq n-2$, respectively; 2) the time taken for the process from $M_{sd}$ to $M_{s(d+1)}$ and $M_{s(d+1)}$ to $M_{s(d+2)}$ may be different. Thus, the key to find a feasible and optimal schedule for the process from $M_{sd}$ to $M_{s(d+2)}$ is to dynamically adjust the robot waiting time $\omega_{i-1}$. However, increasing and decreasing $\omega_{i-1}$ would decrease and increase the wafer sojourn time respectively. This makes it difficult to guarantee the feasibility and optimality at the same time. Thus, a linear programming model is developed to solve this problem. Let $t_{ij}^d$ and $w_i^d$ denote the time when firing $t_{ij}$ completes and the robot waiting at Step i before unloading a wafer during the process from $M_{sd}$ to $M_{s(d+1)}$, respectively. Then, we have a linear programming model.

Linear Programming Model (LPM): If $[\vartheta_{1L}, \vartheta_{1U}] \cap [\vartheta_{2L}, \vartheta_{2U}] \cap \ldots \cap [\vartheta_{nL}, \vartheta_{nU}] = \emptyset$ and the system checked by Theorem 2 is schedulable under the steady state, then a schedule can be found by the following LPM:

$$\min \sum_{d=1}^{n} \sum_{i=0}^{d} \omega_i^d \tag{18}$$

subject to $$t_{11}^0 = \alpha_0 + \mu + \alpha, \tag{19}$$

$$t_{12}^1 = t_{11}^0 + \omega_1^1 + \alpha, \tag{20}$$

$$t_{i1}^d = t_{(i-1)2}^d + \mu + \alpha, \ 1 \leq i \leq d+1 \text{ and } 1 \leq d \leq n-1, \tag{21}$$

$$t_{i2}^d = t_{(i+2)1}^d + \mu + \omega_i^d + \alpha, \ 1 \leq i \leq d-1 \text{ and } 1 \leq d \leq n-1, \tag{22}$$

$$t_{02}^d = t_{(d+1)1}^d + \mu + \omega_0^d + \alpha_0, \ 1 \leq d \leq n-1, \tag{23}$$

$$t_{d2}^d = t_{11}^{d-1} + \mu + \omega_d^d + \alpha, \ 2 \leq d \leq n-1, \tag{24}$$

$$t_{i1}^d = t_{(i-1)2}^d + \mu + \alpha, \ 1 \leq i \leq n \text{ and } d \in \{n, n+1\}, \tag{25}$$

$$t_{01}^d = t_{n2}^d + \mu + \alpha, \ d \in \{n, n+1\}, \tag{26}$$

$$t_{i2}^d = t_{(i+2)1}^d + \mu + \omega_i^d + \alpha, \ 1 \leq i \leq n-2 \text{ and } d \in \{n, n+1\}, \tag{27}$$

$$t_{(n-1)2}^d = t_{01}^d + \mu + \omega_{n-1}^d + \alpha, \ d \in \{n, n+1\}, \tag{28}$$

$$t_{n2}^d = t_{11}^{d-1} + \mu + \omega_n^d + \alpha, \ d \in \{n, n+1\}, \tag{29}$$

$$t_{02}^d = t_{21}^d + \mu + \omega_0^d + \alpha_0, \ d \in \{n, n+1\}, \tag{30}$$

$$\omega_i^n = \omega_i^{n+1}, \ 0 \leq i \leq n, \tag{31}$$

$$\sum_{d=1}^{n} \sum_{i=0}^{d} \omega_i^d \geq 0, \tag{32}$$

and $$a_i \leq t_{i2}^d - \alpha - t_{i1}^{d-1} \leq a_i + \delta_i, \ 1 \leq i \leq d \text{ and } 1 \leq d \leq n+1. \tag{33}$$

For a single-arm cluster tool with two processing steps, the robot task sequence for the start-up process from $M_{s0}$ to $M_{s2}$ is $\sigma_1$. Then, the system is operated with the backward strategy based on the PN model in FIG. 2. For a tool with $n > 2$ processing steps, the robot task sequence for the start-up process from $M_{s0}$ to $M_{s2}$ is also $\sigma_1$. Then, the system will run according to the PN model in FIG. 3 till it reaches state $M_{sn}$. In the following operations, the system is operated by the backward strategy based on the PN model in FIG. 2. Notice that the robot task sequence for the start-up process of the two cases is known in advance. However, the robot waiting time is unknown. If the waiting time during the process from $M_{s0}$ to $M_{sn}$ is determined, the schedule for the start-up process is determined. Objective (18) in LPM is to minimize the total robot waiting time. Constraints (19) and (21) give the time for completing the robot task of loading a wafer into a step. Constraints (20) and (22)-(24) represent the time for completing the robot task of unloading a wafer from a step. After $M_{sn}$ is reached, the cluster tool enters its steady state and operates by the backward strategy based on the PN model in FIG. 2 and CP1. Then, when the first robot task cycle for the steady state is completed, state $M_{s(n+1)}$ is reached. When the second robot task cycle for the steady state is completed, state $M_{s(n+2)}$ is reached. Thus, for the first and second cycles for the steady state, Constraints (25) and (26) mean the time for completing the robot task of loading a wafer into a step, and Constraints (27)-(30) indicate the time for completing the robot task of unloading a wafer from a step. Constraint (31) makes sure that the robot waiting time is same for the different cycle under the steady state. Constraint (32) means that the robot waiting time is no less than zero. With wafer residency time constraints being considered, Constraint (33) is used to guarantee such constraints to be satisfied. In this way, a schedule for the start-up process could be obtained by this model.

For the case with $[\vartheta_{1L}, \vartheta_{1U}] \cap [\vartheta_{2L}, \vartheta_{2U}] \cap \ldots \cap [\vartheta_{nL}, \vartheta_{nU}] \neq \emptyset$, Theorem 2 gives schedulability conditions to check if the system is schedulable. Thus, it gives rise to a question that, for the case with $[\vartheta_{1L}, \vartheta_{1U}] \cap [\vartheta_{2L}, \vartheta_{2U}] \cap \ldots \cap [\vartheta_{nL}, \vartheta_{nU}] \neq \emptyset$, if the system checked by Theorem 2 is schedulable, can a feasible schedule be obtained by LPM? To answer it, a schedule can be obtained by setting the robot waiting time as: 1) For the tool with two processing steps, the robot waiting time can be set as $\omega_0^d = \max\{\vartheta_{max} - \vartheta_{1U}, 0\}$, $d \in \{1, 2\}$, $\omega_1^1 = a_1$, $\omega_1^2 = \max\{\vartheta_{max} - \vartheta_{2U}, 0\}$, and $\omega_2^2 = \vartheta_{max} - \Psi_1 - (\omega_0^2 + \omega_1^2)$; and 2) For the tool with more than n>2 processing steps, the robot waiting time can be set as $\omega_i^d = \max\{\vartheta - \vartheta_{(i+1)U}, 0\}$, $0 \leq i \leq n-1$ and $2 \leq d \leq n+1$, $\omega_1^1 = a_1$, and $\omega_d^d = \vartheta_{max} - \Psi_1 - \Sigma_{i=0}^{d-1} \omega_i^d$, $2 \leq d \leq n+1$. It is easy to verify that this schedule is in the feasible region of LPM. Therefore, if the system is schedulable according to Theorem 2's conditions, a feasible and optimal schedule can be obtained by LPM. For the first and second cycles for the steady state, the robot waiting time $\omega_i^n$ and $\omega_i^{n+1}$, $0 \leq i \leq n$, can be determined by LPM. Then, in the following operations of the system under the steady state, the robot waiting time is also set as $\omega_i = \omega_i^n$, $0 \leq i \leq n-1$, and $\omega_n = \vartheta_{max} - \Sigma_{i=0}^{n-1} \omega_i$. Thus, another question is if the schedule for the steady state is feasible and optimal? The following theorem answers it.

Theorem 5: For a single-arm cluster tool with $[\vartheta_{1L}, \vartheta_{1U}] \cap [\vartheta_{2L}, \vartheta_{2U}] \cap \ldots \cap [\vartheta_{nL}, \vartheta_{nU}] \neq \emptyset$, with the PN in FIG. 2 and CP1, if a schedule for the steady state is given by setting $\omega_i = \omega_i^n$, $0 \leq i \leq n-1$, and $\omega_n = \vartheta_{max} - \Sigma_{i=0}^{n-1} \omega_i$, $\omega_i^n$, $0 \leq i \leq n-1$ is obtained by LPM, then such a schedule is feasible and optimal.

Proof: By LPM, during the processes from $M_{sn}$ to $M_{s(n-1)}$ and $M_{s(n+1)}$ to $M_{s(n+2)}$, the robot waiting time is $\omega_i = \omega_i^n$, $0 \leq i \leq n$. Then, the cycle time for the processes from $M_{sn}$ to $M_{s(n+1)}$ and $M_{s(n+1)}$ to $M_{s(n+2)}$ should be $\Psi = \vartheta_{max}$. If there exists a schedule with the cycle time $\Psi < \vartheta_{max}$ and it is assumed that $\vartheta_{max} = \vartheta_{kL}$, $k \neq 1$ holds, it follows from (9) that $\tau_k = [2(n+1)\mu + (2n+1)\alpha + \alpha_0 + \Sigma_{d=0}^n \omega_d] - (4\alpha + 3\mu + \omega_{k-1}) = \Psi - (4\alpha + 3\mu + \omega_{k-1}) < \vartheta_{kL} - (4\alpha + 3\mu + \omega_{k-1}) \leq \vartheta_{kL} - (4\alpha + 3\mu)$. Then, from (5), we have $\tau_k < \vartheta_{kL} - (4\alpha + 3\mu) = a_k$. This means that the wafer at Step k is not completed. Similarly, if there exists a schedule with the cycle time $\Psi < \vartheta_{max}$ and $\vartheta_{max} = \vartheta_{1L}$ holds, we have $\tau_1 < a_1$. Therefore, the cycle time for the processes from $M_{sn}$ to $M_{s(n+1)}$ and $M_{s(n+1)}$ to $M_{s(n+2)}$ should be $\Psi = \vartheta_{max}$. This implies that $\Sigma_{i=0}^n \omega_i = \vartheta_{max} - \Psi_1$. Thus, based on LPM and Theorem 2, this theorem holds and the cycle time of the system for the steady state is $\vartheta_{max}$.

Up to now, for the case that the workloads among the steps can be properly balanced, i.e. $[\vartheta_{1L}, \vartheta_{1U}] \cap [\vartheta_{2L}, \vartheta_{2U}] \cap \ldots \cap [\vartheta_{nL}, \vartheta_{nU}] \neq \emptyset$, a scheduling algorithm is proposed to find the optimal schedule for the start-up process such that the single-arm cluster tool can enter its steady state optimally. For the case that the differences of the workloads among the steps are too large such that $[\vartheta_{1L}, \vartheta_{1U}] \cap [\vartheta_{2L}, \vartheta_{2U}] \cap \ldots \cap [\vartheta_{nL}, \vartheta_{nU}] \neq \emptyset$, a linear programming model is developed to find a feasible and optimal schedule to transfer a single-arm cluster tool from the initial state to a steady one. Notice that Scheduling Algorithm 1 consists of several expressions and LPM is a linear programming model. Therefore, it is very computationally efficient to use the proposed methods to find a feasible and optimal schedule for the start-up process for single-arm cluster tools with wafer residency time constraints.

EXAMPLES

Example 1: The flow pattern is $(PM_1, PM_2, PM_3, PM_4, PM_5)$. It takes 5 s for the robot to unload a wafer from a PM and to load a wafer to a PM/LL ($\alpha = 5$ s), 10 s to unload a wafer from the LLs and align it ($\alpha_0 = 10$ s), and 2 s to move between PMs/LLs =2 s). It needs 90 s, 100 s, 100 s, 105 s, and 115 s for a PM at Steps 1-5 to process a wafer ($a_1 = 90$ s, $a_2 = 100$ s, $a_3 = 100$ s, $a_4 = 105$ s, and $a_5 = 115$ s), respectively. After being processed, a wafer at Steps 1-4 can stay there for 20 s ($\delta_1 = \delta_2 = \delta_3 = \delta_4 = \delta_5 20$ s).

Figure 4:
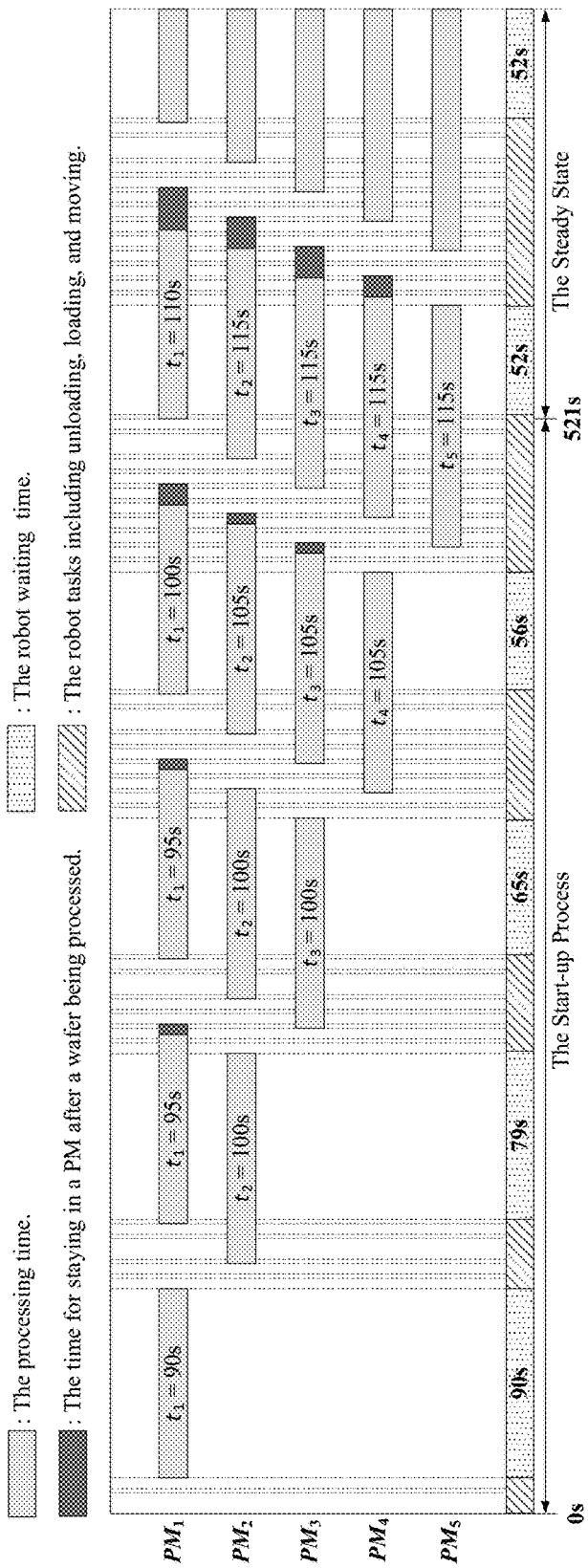
FIG. 4 shows the simulation results for Example 1.

It follows from (5)-(8) that, we have $\vartheta_{1L} = 121$ s, $\vartheta_{1U} = 141$ s, $\vartheta_{2L} = 126$ s, $\vartheta_{2U} = 146$ s, $\vartheta_{3L} = 126$ s, $\vartheta_{3U} = 146$ s, $\vartheta_{4L} = 131$ s, $\vartheta_{4U} = 151$ s, $\vartheta_{5L} = 141$ s, $\vartheta_{5U} = 161$ s, and $\Psi_1 = 89$ s. By Theorem 1, the single-arm cluster tool is schedulable. For the steady state, an optimal and feasible schedule is obtained by setting $\omega_0 = \omega_1 = \omega_2 = \omega_3 = \omega_4 = 0$ s and $\omega_5 = 52$ s. Then, the cycle time of the system under the steady state is 141 s. For this example, the workloads among the steps are properly balanced, i.e. $[\vartheta_{1L}, \vartheta_{1U}] \cap [\vartheta_{2L}, \vartheta_{2U}] \cap \ldots \cap [\vartheta_{nL}, \vartheta_{nU}] \neq \emptyset$. Thus, an optimal and feasible schedule can be found by Algorithm 1 for the start-up process. This example belongs to Situation 2 of Algorithm 1. Therefore, the robot waiting time during the start-up process is set as follows: 1) During the process from $M_{s0}$ to $M_{s2}$, $\omega_0 = 0$ s and $\omega_1 = 90$ s; 2) During the process from $M_{s2}$ to $M_{s3}$, $\omega_0 = \omega_1 = 0$ s and $\omega_2 = 79$ s; 3) During the process from $M_{s3}$ to $M_{s4}$, $\omega_0 = \omega_1 = \omega_2 = 0$ s and $\omega_3 = 65$ s; 4) During the process from $M_{s4}$ to $M_{s5}$, $\omega_0 = \omega_1 = \omega_2 = \omega_3 = 0$ s and $\omega_4 = 56$ s. In this way, an optimal and feasible schedule is obtained for the start-up process. The simulation result is shown in FIG. 4. It shows that it takes 521 s for the start-up process.

In [Wu et al., 2008], a method is proposed to transfer the system to enter its steady state from the initial state. It puts a virtual token (wafer) in places $p_2$-$p_n$ and none at $p_1$ in FIG. 2, i.e. $M_0(p_i) = 1$, $i \in N_n - \{1\}$, and $M_0(p_1) = 0$ at the initial state. Then, by running the PN model with a schedule obtained by the scheduling algorithm in [Wu et al., 2008], when all the virtual wafers go out of the system, the steady state is reached. It takes 563 s for the start-up process. Therefore, by the method as disclosed herein in the present work, the time taken for the start-up process is reduced by 8.1% compared with the method in [Wu et al., 2008].

Example 2: The flow pattern is $(PM_1, PM_2, PM_3, PM_4)$. $\alpha = 5$ s, $\alpha_0 = 10$ s, $\mu = 2$ s, $a_1 = 85$ s, $a_2 = 85$ s, $a_3 = 110$ s, $a_4 = 120$ s, and $\delta_1 = \delta_2 = \delta_3 = \delta_4 = 20$ s hold.

Figure 5:
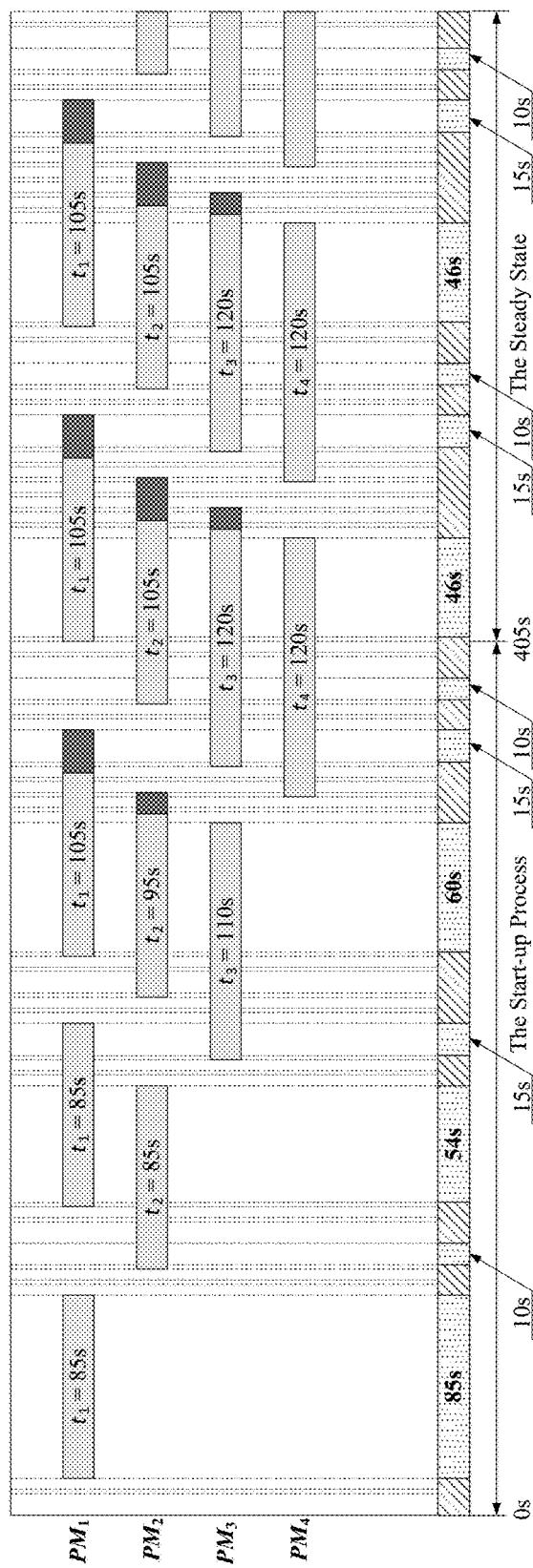
FIG. 5 shows the simulation results for Example 2.

It follows from (5)-(8) that, we have $\vartheta_{1L} = 116$ s, $\vartheta_{1U} = 136$ s, $\vartheta_{2L} = 111$ s, $\vartheta_{2U} = 131$ s, $\vartheta_{3L} = 136$ s, $\vartheta_{3U} = 156$ s, $\vartheta_{4L} = 146$ s, $\vartheta_{4U} = 166$ s, and $\Psi_1 = 75$ s. By Theorem 2, the single-arm cluster tool is schedulable. For the steady state, an optimal and feasible schedule is obtained by setting $\omega_0 = 10$ s, $\omega_1 = 15$ s, $\omega_2 = \omega_3 = 0$ s, and $\omega_4 = 46$ s. Then, the cycle time of the system under the steady state is 146 s. For this example, differences between the workloads among the steps are too large and $[\vartheta_{1L}, \vartheta_{1U}] \cap [\vartheta_{2L}, \vartheta_{2U}] \cap \ldots \cap [\vartheta_{nL}, \vartheta_{nU}] \neq \emptyset$ holds. Thus, LPM is used to find an optimal and feasible schedule for the start-up process. With LPM, the robot waiting time during the start-up process is set as follows: 1) During the process from $M_{s0}$ to $M_{s2}$, $\omega_0 = \omega_0^1 = 10$ s and $\omega_1=\omega_1^1=85$ s; 2) During the process from $M_{s2}$ to $M_{s3}$, $\omega_0=\omega_0^2=0$ s, $\omega_1=\omega_1^2=15$ s and $\omega_2=\omega_2^2=54$ s; 3) During the process from $M_{s3}$ to $M_{s4}$, $\omega_0=\omega_0^3=10$ s, $\omega_1=\omega_1^3=15$ s, $\omega_2=\omega_2^3=0$ s, and $\omega_3=\omega_3^3=60$ s. Then, the tool enters its steady state and it is scheduled by setting $\omega_0=\omega_0^4=10$ s, $\omega_1=\omega_1^4=15$ s, $\omega_2=\omega_3=\omega_2^4=\omega_3^4=0$ s, and $\omega_4=\omega_4^4=46$ s. In this way, an optimal and feasible schedule is obtained for the start-up process. The simulation result is shown in FIG. 5. It shows that it takes 405 s for the start-up process. However, with the existing method in [Wu et al., 2008], it takes 455 s for the start-up process. Thus, the time taken for this start-up process is reduced by 11%.

E. The Present Invention

The present invention is developed based on the theoretical development in Sections A-C above.

An aspect of the present invention is to provide a computer-implemented method for scheduling a cluster tool. The cluster tool comprises a single-arm robot for wafer handling, a LL for wafer cassette loading and unloading, and n process modules each for performing a wafer-processing step with a wafer residency time constraint where the ith process module, $i \in N_n$, is used for performing Step i of the n wafer-processing steps for each wafer. Note that although the cluster tool is said to comprise a LL, it is understood that in the present invention, the cluster tool can have one or more LLs.

The method includes scheduling a start-up process for the cluster tool. The start-up process has plural system states $M_{si}$, i=0, 1, . . . n−1, where $M_{s0}$ is an initial state of system start-up, and $M_{si}$, $1 \le i \le n-1$ denotes that i instances of a wafer unloading from the robot to any one of the n process modules have occurred since the system start-up.

Advantageously, the start-up process is developed based on Scheduling Algorithm 1. When $\vartheta_{max} \le \vartheta_{iU}$ and $\Psi_1 \le \vartheta_{iU}$, i=1, 2, . . . n, values of $\omega_0, \omega_1, \ldots, \omega_d$ for each of the system states $M_{sd}$, d=0, 1, ... n−1, are determined. As mentioned above, $\omega_j$, $J \in \{0, 1, \ldots, d\}$, is a robot waiting time used in the state $M_{sd}$ for the robot to wait before unloading a wafer in Step j from the robot to the (j+1)th process module. According to Scheduling Algorithm 1, the values of $\omega_0$, $\omega_1, \ldots, \omega_d$ and $\omega_d$ are determined by: setting $\omega_0=0$ and $\omega_1=a_1$ for the states $M_{s0}$ and $M_{s1}$; and setting $\omega_i=0$, $i \in N_{d-1} \cup \{0\}$, and $\omega_d = \max\{\vartheta_{dmax} - \Psi_{sd(d+1)1}, 0\}$ for the state $M_{sd}$, $2 \le d \le n-1$ when n>2.

As a steady-state process follows the start-up process, preferably the method further includes scheduling the steady-state process based on the results obtained in the start-up process. In particular, values of $\omega_0, \omega_1, \ldots, \omega_d$ are determined, in which $\omega_j, j \in \{0, 1, \ldots n\}$, is a robot waiting time, used in a steady state of the cluster tool, for the robot to wait before unloading a wafer in Step j from the robot to the (j+1)th process module. As indicated in Section B.2 above, one option is to set $\omega_i=0$, $i \in N_{n-1} \cup \{0\}$, and $\omega_n = \max\{\vartheta_{max} - \Psi_1, 0\}$.

Also advantageously, the start-up process is further developed based on the LPM model. When $[\vartheta_{1L}, \vartheta_{1U}] \cap [\vartheta_{2L}, \vartheta_{2U}] \cap \ldots \cap [\vartheta_{nL}, \vartheta_{nU}] = \emptyset$, values of $\omega_0^d, \omega_1^d, \ldots, \omega_d^d$ for each of the system states $M_{sd}$, d=0, 1, ... , n−1, are determined, where $\omega_j^d, j \in \{0, 1, \ldots, d\}$, is a robot waiting time used in the state $M_{sd}$ for the robot to wait before unloading a wafer in Step j from the robot to the (j+1)th process module. The values of $\omega_0^d, \omega_1^d, \ldots, \omega_d^d$ =0, 1, . . . , n, are numerically optimized such that (18) is minimized subject to constraints (19)-(33). For the steady-state process, Theorem 5 indicates that one option is to set $\omega_i = \omega_i^n$, $0 \le i \le n-1$, and $\omega_n = \vartheta_{max} - \Sigma_{i=0}^{n-1} \omega_i$ for use in the state $M_{sn}$ and thereafter. Similarly, $M_{sn}$ denotes that n instances of a wafer unloading from the robot to any one of the n process modules have occurred since the system start-up.

The embodiments disclosed herein may be implemented using general purpose or specialized computing devices, computer processors, or electronic circuitries including but not limited to digital signal processors (DSP), application specific integrated circuits (ASIC), field programmable gate arrays (FPGA), and other programmable logic devices configured or programmed according to the teachings of the present disclosure. Computer instructions or software codes running in the general purpose or specialized computing devices, computer processors, or programmable logic devices can readily be prepared by practitioners skilled in the software or electronic art based on the teachings of the present disclosure.

In particular, the method disclosed herein can be implemented in a single-arm cluster tool if the cluster tool includes one or more processors. The one or more processors are configured to execute a process of scheduling the cluster tool according to one of the embodiments of the disclosed method.

The present invention may be embodied in other specific forms without departing from the spirit or essential characteristics thereof. The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A computer-implemented method for scheduling a cluster tool, the cluster tool comprising a single-arm robot for wafer handling, a loadlock for wafer cassette loading and unloading, n process modules each for performing a wafer-processing step with a wafer residency time constraint where the ith process module, $i \in \{1, 2, \ldots, n\}$, is used for performing Step i of the n wafer-processing steps for each wafer, and a specialized processor configured to control the robot, the loadlock, and the process modules through execution of the method, the method comprising:

when $\vartheta_{max} \le \vartheta_{iU}$ and $\Psi_1 \le \vartheta_{iU}$, i=1, 2, . . . , n, determining, by the specialized processor, values of $\omega_0, \omega_1, \ldots, \omega_d$ for each of plural system states $M_{sd}$, d=0, 1, . . . , n−1, of the cluster tool, where $M_{si}$, $1 \le i \le n-1$ denotes that i instances of a wafer unloading from the robot to any one of the n process modules have occurred since system start-up, and $\omega_j, j \in \{0, 1, \ldots d\}$, is a robot waiting time used in the state $M_{sd}$ for the robot to wait before unloading a wafer in Step j from the robot to the (j+1)th process module;

wherein the determining of $\omega_0, \omega_1, \ldots, \omega_d$ for each of the system states $M_{sd}$, d=0, 1, . . . , n−1, comprises:

setting, by the specialized processor, $\omega_0=0$ and $\omega_1=a_1$ for the states $M_{s0}$ and $M_{s1}$;

where:

$\vartheta_{max} = \max\{\vartheta_{iL}, i \in N_n\}$;

$\Psi_1 = 2(n+1)\mu + (2n+1)\alpha + \alpha_0$ $\vartheta_{iU} = a_i + 4\alpha + 3\mu + \delta_i$, $i \in N_n \setminus \{1\}$;

$\vartheta_{iU} = a_1 + 3\alpha + \alpha_0 + 3\mu + \delta_1$;

$\vartheta_{iL} = a_i + 4\alpha + 3\mu$, $i \in N_n \setminus \{1\}$;

$\vartheta_{iL} = a_1 + 3\alpha + \alpha_0 + 3\mu$;

$a_i$, $i \in N_n$, is a time that a wafer is processed in the ith process module;

$\delta_i$, is the wafer residency time constraint of Step i, given by a pre-determined longest time for which a wafer in the ith process module is allowed to stay therein after this wafer is processed;

$\alpha$ is a time of loading a wafer to or unloading the wafer to the robot in Step i;

$\mu$ is a time of the robot moving from one wafer-processing step to another;

$\alpha_0$ is a time of the robot unloading a wafer from the loadlock and aligning the same; and $N_m = \{1, 2, \ldots, m\}$ for a positive integer m.

2. The method of claim 1, wherein the determining of $\omega_0, \omega_1, \ldots, \omega_d$ for each of the system states $M_{sd}$, $d=0, 1, \ldots, n-1$, further comprises:

setting $\omega_1 = 0$, $i \in N_{d-1} \cup \{0\}$, and $\omega_d = \max\{\vartheta_{dmax} - \Psi_{sd(d+1)1}, 0\}$ for the state $M_{sd}$, $2 \leq d \leq n-1$ when $n>2$;

where:

$\vartheta_{dmax} = \max\{\vartheta_{iL}, i \in N_d\}$; and $\Psi_{sd(d+1)1} = 2(d+1)\mu + (2+1)\alpha + \alpha_0$.

3. The method of claim 2, further comprising:

when $\vartheta_{max} \leq \vartheta_{iU}$ and $\Psi_1 \leq \vartheta_{iU}$, $i = 1, 2, \ldots, n$, setting, by the specialized processor, $\omega_1 = 0$, $i \in N_{n-1} \cup \{0\}$, and $\omega_n = \max\{\vartheta_{max} - \Psi_1, 0\}$ for use in a state $M_{sn}$ and thereafter, where $M_{sn}$ denotes that n instances of a wafer unloading from the robot to any one of the n process modules have occurred since system start-up, and $\omega_j$, $j \in \{0, 1, \ldots n\}$, is a robot waiting time, used in a steady state of the cluster tool, for the robot to wait before unloading a wafer in Step j from the robot to the (j+1)th process module.

4. The method of claim 3, further comprising:

when $[\vartheta_{1L}, \vartheta_{1U}] \cap [\vartheta_{2L}, \vartheta_{2U}] \cap \ldots \cap [\vartheta_{nL}, \vartheta_{nU}] = \emptyset$, determining, by the specialized processor, values of $\omega_0^d, \omega_1^d, \ldots, \omega_d^d$ for each of the system states $M_{sd}$, $d=0, 1, \ldots, n-1$, where $\omega_j^d$, $j \in \{0, 1, \ldots d\}$, is a robot waiting time used in the state $M_{sd}$ for the robot to wait before unloading a wafer in Step j from the robot to the (j+1)th process module;

wherein the determining of $\omega_0^d, \omega_1^d, \ldots, \omega_d^d$ for each of the system states $M_{sd}$, $d=0, 1, \ldots, n$, comprises:

numerically optimizing the values of $\omega_0^d, \omega_1^d, \ldots, \omega_d^d$ such that $\Sigma_{d=1}^n \Sigma_{i=0}^d \omega_i^d$ is minimized subject to:

$t_{11}^0 = \alpha_0 + \mu + \alpha$;

$t_{12}^1 = t_{11}^0 + \omega_1^1 + \alpha$;

$t_{i1}^d = t_{(i-1)2}^d + \mu + \alpha$, $1 \leq i \leq d+1$ and $1 \leq d \leq n-1$;

$t_{i2}^d = t_{(i+2)1}^d + \mu + \omega_i^d + \alpha$, $1 \leq i \leq d-1$ and $1 \leq d \leq n-1$;

$t_{02}^d = t_{(d+1)1}^d + \mu + \omega_0^d + \alpha_0$, $1 \leq d \leq n-1$;

$t_{d2}^d = t_{11}^{d-1} + \mu + \omega_d^d + \alpha$, $2 \leq d \leq n-1$;

$t_{i1}^d = t_{(i-1)2}^d + \mu + \alpha$, $1 \leq i \leq n$ and $d \in \{n, n+1\}$;

$t_{01}^d = t_{n2}^d + \mu + \alpha$, $d \in \{n, n+1\}$;

$t_{i2}^d = t_{(i+2)1}^d + \mu + \omega_i^d + \alpha$, $1 \leq i \leq n-2$ and $d \in \{n, n+1\}$;

$t_{(n-1)2}^d = t_{01}^d + \mu + \omega_{n-1}^d + \alpha$, $d \in \{n, n+1\}$;

$t_{n2}^d = t_{11}^{d-1} + \mu + \omega_n^d + \alpha$, $d \in \{n, n+1\}$;

$t_{02}^d = t_{21}^{d-1} + \mu + \omega_0^d + \alpha_0$, $d \in \{n, n+1\}$;

$\omega_i^n = \omega_i^{n-1}$, $0 \leq i \leq n$;

$\Sigma_{d=1}^n \Sigma_{i=0}^d \omega_i^d \geq 0$; and $a_i \leq t_{i2}^d - \alpha - t_{i1}^{d-1} \leq a_i + \delta_i$, $1 \leq i \leq d$ and $1 \leq d \leq n+1$;

where:

$t_{i1}^d$ denotes a time when the robot completes loading a wafer into Step i, $i \in N_n \cup \{0\}$;

$t_{i2}^d$ a time when the robot completes unloading a wafer from Step i, $i \in N_n$;

$t_{02}^d$ denotes a time when the robot completes unloading the loadlock and aligning the same; and $\omega_j^d$, $j \in N_n$ and $d \in \{n, n+1\}$, is a robot waiting time used in a state $M_{sd}$ for the robot to wait before unloading a wafer in Step j from the robot to the (j+1)th process module, the state $M_{sd}$ denoting that d instances of a wafer unloading from the robot to any one of the n process modules have occurred since system start-up.

5. The method of claim 4, further comprising:

when $[\vartheta_{1L}, \vartheta_{1U}] \cap [\vartheta_{2L}, \vartheta_{2U}] \cap \ldots \cap [\vartheta_{nL}, \vartheta_{nU}] = \emptyset$, setting, by the specialized processor, $\omega_i = \omega_i^n$, $0 \leq i \leq n-1$, and $\omega_n = \vartheta_{max} - \Sigma_{i=0}^{n-1} \omega_i$ for use in the state $M_{sn}$ and thereafter.

6. A computer-implemented method for scheduling a cluster tool, the cluster tool comprising a single-arm robot for wafer handling, a loadlock for wafer cassette loading and unloading, n process modules each for performing a wafer-processing step with a wafer residency time constraint where the ith process module, $i \in \{1, 2, \ldots, n\}$, is used for performing Step i of the n wafer-processing steps for each wafer, and a specialized processor configured to control the robot, the loadlock, and the process modules through execution of the method, the method comprising:

when $[\vartheta_{1L}, \vartheta_{1U}] \cap [\vartheta_{2L}, \vartheta_{2U}] \cap \ldots \cap [\vartheta_{nL}, \vartheta_{nU}] = \emptyset$, determining, by the specialized processor, values of $\omega_0^d, \omega_1^d, \ldots, \omega_d^d$ for each of plural system states $M_{sd}$, $d=0, 1, \ldots, n-1$, of the cluster tool, where $M_{si}$, $1 \leq i \leq n-1$ denotes that i instances of a wafer unloading from the robot to any one of the n process modules have occurred since system start-up, and $\omega_j^d$, $j \in \{0, 1, \ldots d\}$, is a robot waiting time used in the state $M_{sd}$ for the robot to wait before unloading a wafer in Step j from the robot to the (j+1)th process module;

wherein the determining of $\omega_0^d, \omega_1^d, \ldots, \omega_d^d$ for each of the system states $M_{sd}$, $d=0, 1, \ldots, n$, comprises:

numerically optimizing the values of $\omega_0^d, \omega_1^d, \ldots, \omega_d^d$ such that $\Sigma_{d=1}^n \Sigma_{i=0}^d \omega_i^d$ is minimized subject to:

$t_{11}^0 = \alpha_0 + \mu + \alpha$;

$t_{12}^1 = t_{11}^0 + \omega_1^1 + \alpha$;

$t_{i1}^d = t_{(i-1)2}^d + \mu + \alpha$, $1 \leq i \leq d+1$ and $1 \leq d \leq n-1$;

$t_{i2}^d = t_{(i+2)1}^d + \mu + \omega_i^d + \alpha$, $1 \leq i \leq d-1$ and $1 \leq d \leq n-1$;

$t_{02}^d = t_{(d+1)1}^d + \mu + \omega_0^d + \alpha_0$, $1 \leq d \leq n-1$;

$t_{d2}^d = t_{11}^{d-1} + \mu + \omega_d^d + \alpha$, $2 \leq d \leq n-1$;

$t_{i1}^d = t_{(i-1)2}^d + \mu + \alpha$, $1 \leq i \leq n$ and $d \in \{n, n+1\}$;

$t_{01}^d = t_{n2}^d + \mu + \alpha$, $d \in \{n, n+1\}$;

$t_{i2}^d = t_{(i+2)1}^d + \mu + \omega_i^d + \alpha$, $1 \leq i \leq n-2$ and $d \in \{n, n+1\}$;

$t_{(n-1)2}^d = t_{01}^d + \mu + \omega_{n-1}^d + \alpha$, $d \in \{n, n+1\}$;

$t_{n2}^d = t_{11}^{d-1} + \mu + \omega_n^d + \alpha$, $d \in \{n, n+1\}$;

$t_{02}^d = t_{21}^{d-1} + \mu + \omega_0^d + \alpha_0$, $d \in \{n, n+1\}$;

$\omega_i^n = \omega_i^{n-1}$, $0 \leq i \leq n$;

$\Sigma_{d=1}^n \Sigma_{i=0}^d \omega_i^d \geq 0$; and $a_i \leq t_{i2}^d - \alpha - t_{i1}^{d-1} \leq a_i + \delta_i$, $1 \leq i \leq d$ and $1 \leq d \leq n+1$;

where:

$\vartheta_{iU} = a_i + 4\alpha + 3\mu + \delta_i$, $i \in N_n \setminus \{1\}$;

$\vartheta_{iU} = a_1 + 3\alpha + \alpha_0 + 3\mu + \delta_1$;

$\vartheta_{iL} = a_i + 4\alpha + 3\mu$, $i \in N_n \setminus \{1\}$;

$\vartheta_{iU} = a_1 + 3\alpha + \alpha_0 + 3\mu$;

$t_{i1}^d$ denotes a time when the robot completes loading a wafer into Step i, $i \in N_n \cup \{0\}$;

$t_{i2}^d$ a time when the robot completes unloading a wafer from Step i, $i \in N_n$;

$t_{02}^d$ denotes a time when the robot completes unloading the loadlock and aligning the same; and $\omega_j^d$, $j \in N_n$ and $d \in \{n, n+1\}$, is a robot waiting time used in a state $M_{sd}$ for the robot to wait before unloading a wafer in Step j from the robot to the (j+1)th process module, the state $M_{sd}$ denoting that d instances of a wafer unloading from the robot to any one of the n process modules have occurred since system start-up;

$a_i$, $i \in N_n$, is a time that a wafer is processed in the ith process module;

$\delta_i$, is the wafer residency time constraint of Step i, given by a pre-determined longest time for which a wafer in the ith process module is allowed to stay therein after this wafer is processed;

$\alpha$ is a time of loading a wafer to or unloading the wafer to the robot in Step i;

$\mu$ is a time of the robot moving from one wafer-processing step to another;

$\alpha_0$ is a time of the robot unloading a wafer from the loadlock and aligning the same; and $N_m = \{1, 2, \ldots, m\}$ for a positive integer m.

7. The method of claim 6, further comprising:

when $[\vartheta_{1L}, \vartheta_{1U}] \cap [\vartheta_{2L}, \vartheta_{2U}] \cap \ldots \cap [\vartheta_{nL}, \vartheta_{nU}] = \emptyset$, setting, by the processor, $\omega_i = \omega_i^n$, $0 \leq i < n-1$, and $\omega_n = \vartheta_{max} - \Sigma_{i=0}^{n-1} \omega_i$ for use in the state $M_{sn}$ and thereafter, where $\omega_j$, $j \in \{0, 1, \ldots n\}$, is a robot waiting time, used in a steady state of the cluster tool, for the robot to wait before unloading a wafer in Step j from the robot to the (j+1)th process module.

8. A cluster tool comprising a single-arm robot for wafer handling, a loadlock for wafer cassette loading and unloading, and plural process modules each for performing a wafer-processing step with a wafer residency time constraint, wherein the cluster tool further comprises one or more specialized processors configured to execute a process of scheduling the cluster tool according to the method of claim 1.

9. A cluster tool comprising a single-arm robot for wafer handling, a loadlock for wafer cassette loading and unloading, and plural process modules each for performing a wafer-processing step with a wafer residency time constraint, wherein the cluster tool further comprises one or more specialized processors configured to execute a process of scheduling the cluster tool according to the method of claim 2.

10. A cluster tool comprising a single-arm robot for wafer handling, a loadlock for wafer cassette loading and unloading, and plural process modules each for performing a wafer-processing step with a wafer residency time constraint, wherein the cluster tool further comprises one or more specialized processors configured to execute a process of scheduling the cluster tool according to the method of claim 3.

11. A cluster tool comprising a single-arm robot for wafer handling, a loadlock for wafer cassette loading and unloading, and plural process modules each for performing a wafer-processing step with a wafer residency time constraint, wherein the cluster tool further comprises one or more specialized processors configured to execute a process of scheduling the cluster tool according to the method of claim 4.

12. A cluster tool comprising a single-arm robot for wafer handling, a loadlock for wafer cassette loading and unloading, and plural process modules each for performing a wafer-processing step with a wafer residency time constraint, wherein the cluster tool further comprises one or more specialized processors configured to execute a process of scheduling the cluster tool according to the method of claim 5.

13. A cluster tool comprising a single-arm robot for wafer handling, a loadlock for wafer cassette loading and unloading, and plural process modules each for performing a wafer-processing step with a wafer residency time constraint, wherein the cluster tool further comprises one or more specialized processors configured to execute a process of scheduling the cluster tool according to the method of claim 6.

14. A cluster tool comprising a single-arm robot for wafer handling, a loadlock for wafer cassette loading and unloading, and plural process modules each for performing a wafer-processing step with a wafer residency time constraint, wherein the cluster tool further comprises one or more specialized processors configured to execute a process of scheduling the cluster tool according to the method of claim 7.

* * * * *